(12) United States Patent
Mano et al.

(10) Patent No.: US 11,822,215 B2
(45) Date of Patent: Nov. 21, 2023

(54) IMAGE CAPTURING APPARATUS HAVING A FAN THAT GENERATES AIR FLOW IN A DUCT FOR HEAT DISSIPATION

(71) Applicant: CANON KABUSHIKI KAISHA, Tokyo (JP)

(72) Inventors: Hayato Mano, Tokyo (JP); Ryoma Yoshimori, Miyoshi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 347 days.

(21) Appl. No.: 16/902,708

(22) Filed: Jun. 16, 2020

(65) Prior Publication Data

US 2021/0055631 A1 Feb. 25, 2021

(30) Foreign Application Priority Data

Aug. 20, 2019 (JP) .................. 2019-150316

(51) Int. Cl.
*G03B 17/55* (2021.01)
*H05K 7/20* (2006.01)
(Continued)

(52) U.S. Cl.
CPC ............ *G03B 17/55* (2013.01); *H04N 23/51* (2023.01); *H04N 23/52* (2023.01); *H04N 23/54* (2023.01);
(Continued)

(58) Field of Classification Search
CPC .... G03B 17/55; H04N 5/2251; H04N 5/2252; H04N 5/22521; H04N 5/2253; H04N 5/2254; H04N 5/2257; H04N 5/2258; H04N 1/00981; H04N 1/00984; H04N 23/51; H04N 23/52; H04N 23/54; H05K 7/20136; H05K 7/20145; H05K 7/20172; H05K 7/20209; H05K 7/20418; G06F 1/20; G06F 1/203; G06F 1/206
See application file for complete search history.

(56) References Cited

U.S. PATENT DOCUMENTS

2005/0084252 A1* 4/2005 Satou ................. G11B 33/1406
386/230
2011/0108250 A1* 5/2011 Horng ................ H05K 7/20154
165/121
(Continued)

FOREIGN PATENT DOCUMENTS

JP 2018164250 A * 10/2018 ............... G02B 7/02
JP 2018164250 A 10/2018

*Primary Examiner* — Twyler L Haskins
*Assistant Examiner* — Akshay Trehan
(74) *Attorney, Agent, or Firm* — ROSSI, KIMMS & McDOWELL LLP

(57) ABSTRACT

An image capturing apparatus that is improved in performance for cooling an apparatus body and a recording medium. The image capturing apparatus includes an image sensor, a circuit board disposed substantially parallel to the image sensor, and a cooling unit configured to cool at least one of the image sensor and the circuit board. The cooling unit includes a duct having an air flow passage crossing an optical axis of the image sensor, and a fan that causes air to flow in the air flow passage in the duct. An air inlet port and an air outlet port of the duct are disposed adjacent to each other such that the air outlet port does not face toward the air inlet port.

13 Claims, 31 Drawing Sheets

(51) Int. Cl.
*H04N 23/51* (2023.01)
*H04N 23/52* (2023.01)
*H04N 23/54* (2023.01)

(52) U.S. Cl.
CPC ..... *H05K 7/20145* (2013.01); *H05K 7/20418* (2013.01)

(56) References Cited

U.S. PATENT DOCUMENTS

| | | | | |
|---|---|---|---|---|
| 2014/0055671 | A1* | 2/2014 | Kawamura | H04N 5/64 348/374 |
| 2015/0195952 | A1* | 7/2015 | Tsunoda | G06F 1/203 361/690 |
| 2016/0295095 | A1* | 10/2016 | Jannard | H05K 7/20172 |
| 2016/0301819 | A1* | 10/2016 | Petty | G03B 17/55 |
| 2017/0131621 | A1* | 5/2017 | Tang | G03B 15/04 |
| 2018/0376037 | A1* | 12/2018 | Arai | H05K 7/20172 |
| 2019/0154949 | A1* | 5/2019 | Hosoe | G05D 23/1919 |
| 2019/0174030 | A1* | 6/2019 | Kojima | H04N 23/54 |
| 2020/0120250 | A1* | 4/2020 | Colin | H05K 7/20145 |

* cited by examiner

IMAGE CAPTURING APPARATUS HAVING A FAN THAT GENERATES AIR FLOW IN A DUCT FOR HEAT DISSIPATION

BACKGROUND OF THE INVENTION

Field of the Invention

The present invention relates to an image capturing apparatus having a heat dissipation structure.

Description of the Related Art

An image capturing apparatus, such as a digital video camera and a digital still camera, has a strong demand for improved performance of an image sensor so as to achieve higher image quality and higher frame rate. However, the image sensor consumes more power and generates a larger amount of heat as the image capturing apparatus achieves higher image quality and higher frame rate. In general, as the temperature of the image sensor is higher, the performance thereof is lowered, and hence it is necessary to promptly dissipate heat generated in the image sensor so as to prevent the temperature of the image sensor from becoming higher than a predetermined temperature.

Further, conventionally, the image capturing apparatus has a strong demand for reduced size thereof. When the image capturing apparatus is reduced in size, a space for arranging a sensor circuit board on which the image sensor is mounted and a main circuit board on which electronic components for processing control signals and image signals is reduced, so that a distance between the circuit boards is reduced. Therefore, it is required to prevent heat generated by the components mounted on the main circuit board from increasing the temperature of the image sensor.

Further, in an image capturing apparatus that handles a large amount of image data (video data), various types of data are recorded and reproduced using a card-shaped recording medium (hereinafter referred to as the "medium card"). The medium card has a demand for larger recording capacity and higher transfer rate. Assuming that the transfer rate is made higher, the power consumption increases, causing an increase in the amount of generated heat, so that the generated heat increases the temperature of the medium card, resulting in a lowered performance of the medium card.

To solve this problem, as a measure of heat dissipation for the image sensor, the main circuit board, and a medium circuit board, there has been proposed an image capturing apparatus configured to draw air from an inlet port into a casing thereof and discharge the air to the outside of the casing through an outlet port, using a fan (see e.g. Japanese Laid-Open Patent Publication (Kokai) No. 2018-164250). Japanese Laid-Open Patent Publication (Kokai) No. 2018-164250 discloses a heat dissipation structure using the fan and ducts, in a product layout in which a sensor and a main circuit board are arranged substantially parallel to each other. Further, the publication discloses an arrangement in which a duct having an air flow passage for drawing air from the inlet port and discharge the air through the outlet port, using the fan, is provided on a holding case for a medium card.

However, the technique described in Japanese Laid-Open Patent Publication (Kokai) No. 2018-164250 has a difficulty in sufficiently dissipating heat which is expected to further increase in accordance with higher performance of the image capturing apparatus and the medium card, to the outside, while avoiding increase in the size of the image capturing apparatus.

SUMMARY OF THE INVENTION

The present invention provides an image capturing apparatus that is improved in performance for cooling an apparatus body and a recording medium.

In a first aspect of the present invention, there is provided an image capturing apparatus including an image sensor, a circuit board disposed substantially parallel to the image sensor, and a cooling unit configured to cool at least one of the image sensor and the circuit board, wherein the cooling unit comprises a duct having an air flow passage crossing an optical axis of the image sensor, and a fan that causes air to flow in the air flow passage in the duct, and wherein an air inlet port and an air outlet port of the duct are disposed adjacent to each other such that the air outlet port does not face toward the air inlet port.

In a second aspect of the present invention, there is provided an image capturing apparatus comprising a fan, a first circuit board, a first duct that is connected to one surface of the first circuit board via a first elastic heat transfer member, a second duct that is connected to another surface of the first circuit board via a second elastic heat transfer member, and a second circuit board that is connected to the second duct via a third elastic heat transfer member, and has an image sensor mounted thereon, wherein the first duct and the second duct are fastened via the first circuit board.

In a third aspect of the present invention, there is provided an image capturing apparatus having a plurality of heat sources, comprising a fan, a first circuit board that is one of the heat sources, a second circuit board that is one of the heat sources and is disposed substantially parallel to the first circuit board, and a duct that is disposed between the first circuit board and the second circuit board and is thermally connected to the first circuit board and the second circuit board, wherein the fan and the second circuit board are connected to the same surface of the duct.

In a fourth aspect of the present invention, there is provided an image capturing apparatus having a plurality of heat sources, comprising a first circuit board that is one of the heat sources, a first duct that has a first flow passage for cooling the first circuit board, a fan that is connected to the first duct, a second circuit board that is one of the heat sources and is located on an opposite side of the fan from the first circuit board, and a second duct for cooling the second circuit board, wherein the first duct has an air flow passage control plate forming a second air flow passage separated from the first air flow passage, and wherein the second duct is connected to the second air flow passage.

In a fifth aspect of the present invention, there is provided an image capturing apparatus having a plurality of heat sources, comprising a holding member that holds a recording medium that is one of the heat sources, a circuit board to which the holding member is fixed, a duct that has an air inlet port and an air outlet port and is thermally connected to the circuit board, and a fan that draws air from the air inlet port and discharges the air from the air outlet port, wherein fins are provided on a wall surface of the duct.

In a sixth aspect of the present invention, there is provided an image capturing apparatus having a plurality of heat sources, comprising a holding member that holds a recording medium that is one of the heat sources, a circuit board to which the holding member is fixed, a duct that has an air inlet port and an air outlet port and is thermally connected to the circuit board, a fan that draws air from the air inlet port and discharges the air from the air outlet port, and a rib-shaped member provided within the duct such that the rib-shaped member extends from the vicinity of the air outlet port of the duct and crosses an air flow passage connecting between the air inlet port and the air outlet port.

In a seventh aspect of the present invention, there is provided an image capturing apparatus having a plurality of heat sources, comprising a holding member that holds a recording medium that is one of the heat sources, a circuit board to which the holding member is fixed, and a first duct that has an air inlet port and an air outlet port and is thermally connected to the circuit board, wherein the holding member is connected to a portion of the first duct in the vicinity of the air inlet port by a heat conductive member.

According to the present invention, it is possible to provide the image capturing apparatus that is improved in performance for cooling the apparatus body and the recording medium.

Further features of the present invention will become apparent from the following description of exemplary embodiments (with reference to the attached drawings).

DESCRIPTION OF THE EMBODIMENTS

Figure 1:
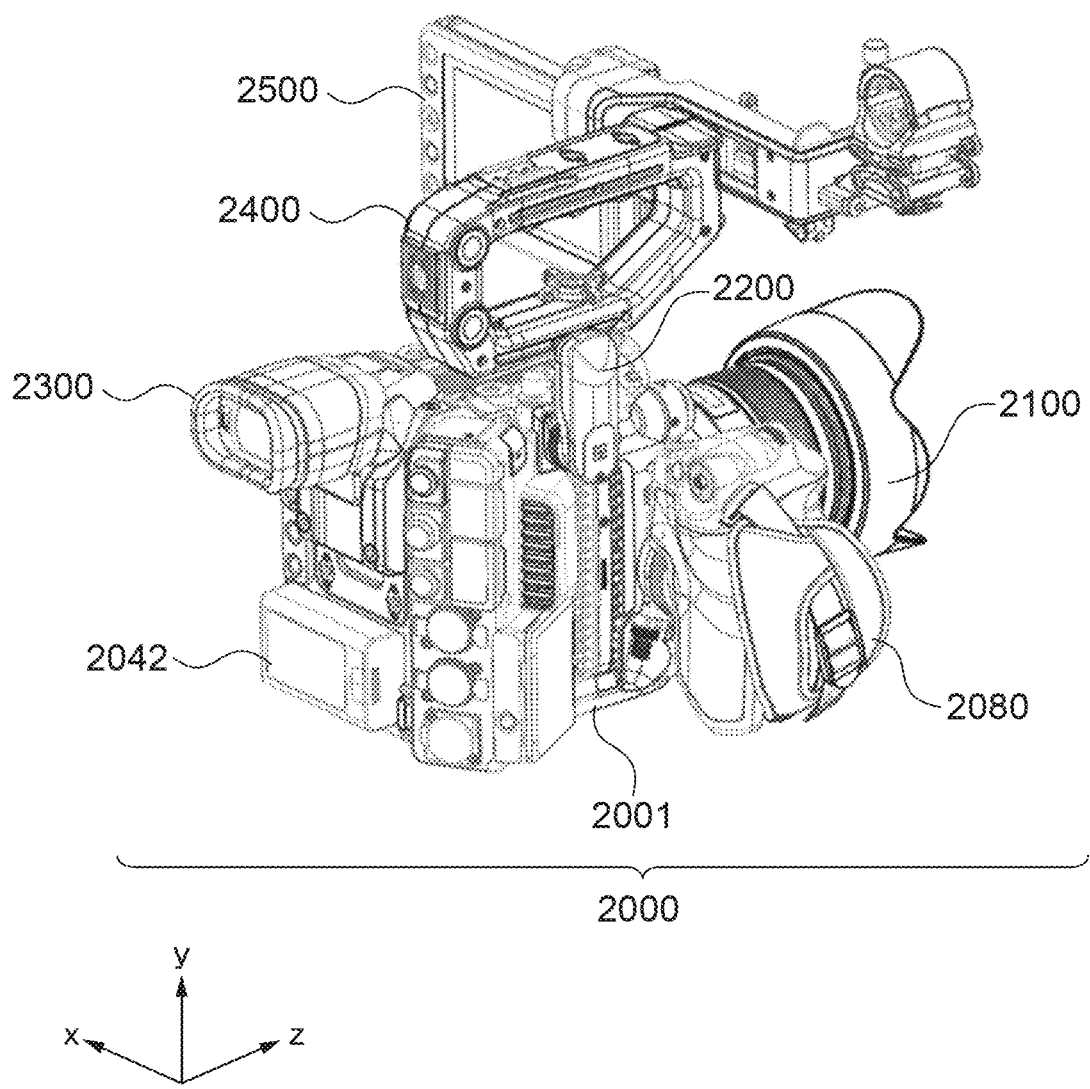
FIG. 1 is a perspective view showing the appearance of an image capturing system according to an embodiment of the present invention.

The present invention will now be described in detail below with reference to the accompanying drawings showing embodiments thereof. FIG. 1 is a perspective view showing the appearance of an image capturing system 2000 according to an embodiment of the present invention. The image capturing system 2000 is comprised of an image capturing apparatus body 2001, a grip unit 2080, a lens barrel 2100, a wireless unit 2200, a viewfinder unit 2300, a handle 2400, a panel unit 2500, and a battery 2042.

Figure 2:
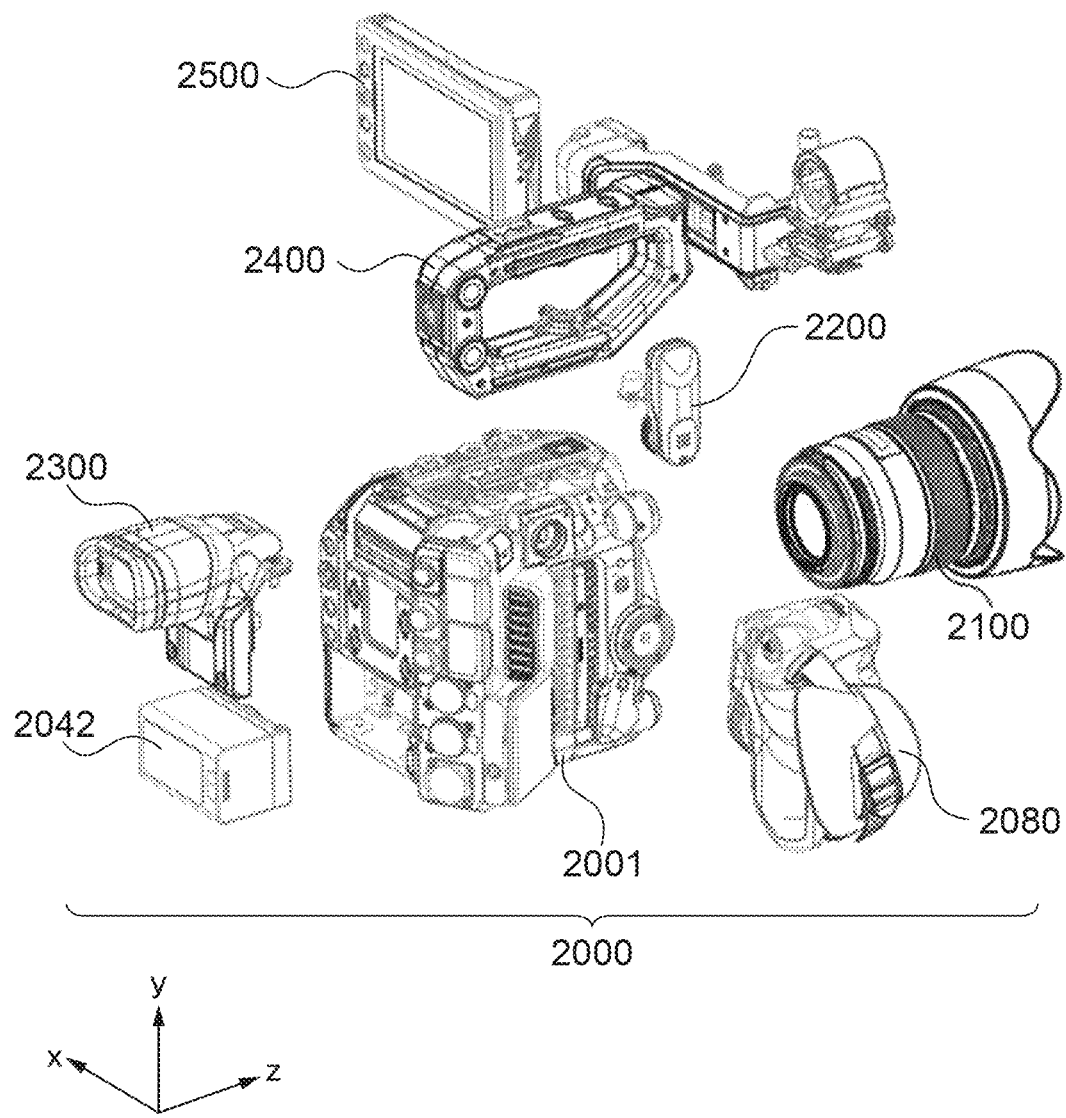
FIG. 2 is an exploded perspective view of the image capturing system.

FIG. 2 is an exploded perspective view of the image capturing system 2000 (in a state in which the units are made separate from the image capturing apparatus body 2001). The grip unit 2080, the lens barrel 2100, the wireless unit 2200, the viewfinder unit 2300, and the panel unit 2500 each have connection means for connecting to the image capturing apparatus body 2001.

To make clear correspondence between the drawings of the image capturing system 2000, coordinate axes orthogonal to each other are set as shown in FIGS. 1 and 2. A z-axis is an axis representing a front-rear direction of the image capturing apparatus body 2001, and a direction from a rear side toward a front side of the image capturing apparatus body 2001 is defined as a positive direction. A y-axis is an axis representing a vertical direction of the image capturing apparatus body 2001, and a direction from a bottom side toward a top side is defined as a positive direction. An x-axis is an axis representing a left-right direction of the image capturing apparatus body 2001, and a direction from a right side toward a left side, as viewed from the rear, is defined as a positive direction. The directions of the respective axes, defined as above, are used in the following description, on an as-needed basis.

Figure 3:
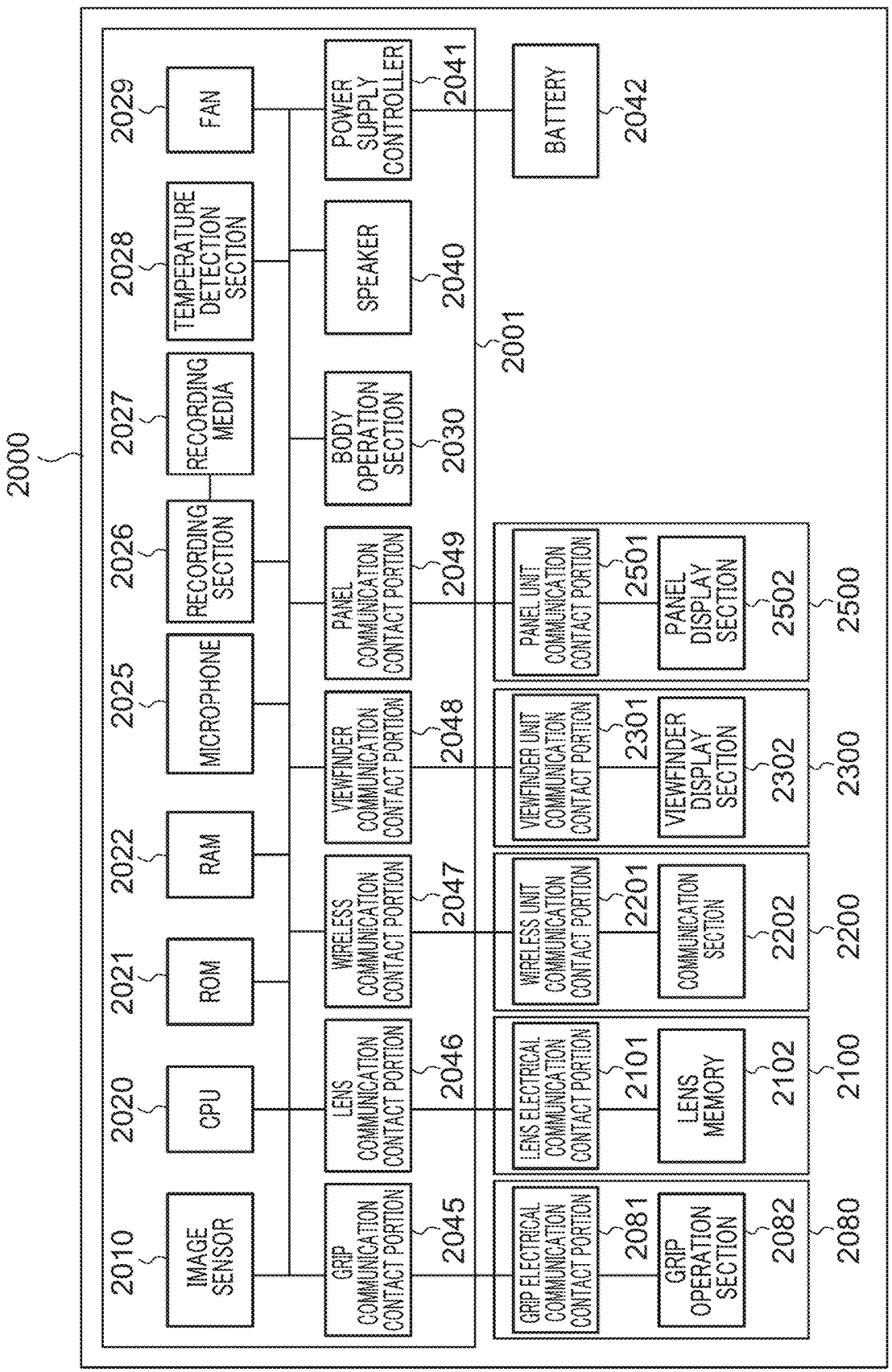
FIG. 3 is a schematic block diagram of the image capturing system.

FIG. 3 is a schematic block diagram of the image capturing system 2000. The image capturing apparatus body 2001 includes an image sensor 2010, a CPU 2020, a ROM 2021, a RAM 2022, a microphone 2025, a recording section 2026, a body operation section 2030, a speaker 2040, and a power supply controller 2041. Further, the image capturing apparatus body 2001 includes a grip communication contact portion 2045, a lens communication contact portion 2046, a wireless communication contact portion 2047, a viewfinder communication contact portion 2048, and a panel communication contact portion 2049.

The grip unit 2080 includes a grip electrical communication contact portion 2081 and a grip operation section 2082. The lens barrel 2100 includes a lens electrical communication contact portion 2101 and a lens memory 2102. The wireless unit 2200 includes a wireless unit communication contact portion 2201 and a communication section 2202. The viewfinder unit 2300 includes a viewfinder unit communication contact portion 2301 and a viewfinder display section 2302. The panel unit 2500 includes a panel unit communication contact portion 2501 and a panel display section 2502.

The image sensor 2010 is a CCD or a CMOS image sensor, and includes an analog-to-digital converter. The lens barrel 2100 causes incident light to form an optical image on the image sensor 2010, and the image sensor 2010 converts the optical image formed thereon to analog electrical signals, further converts the analog electrical signals to digital signals using the analog-to-digital converter, and outputs the digital signals as video data.

The CPU 2020, the ROM 2021, and the RAM 2022 are mounted on a main circuit board 1001 (see FIGS. 7 to 12). The ROM 2021 is an electrically erasable and recordable memory, and for example, an EEPROM is used. The ROM 2021 stores constants, programs, etc. for the operation of the CPU 2020. The CPU 2020 realizes the centralized control of the image capturing apparatus body 2001 by executing the programs stored in the ROM 2021 to thereby control the operations of the components of the image capturing apparatus body 2001.

The RAM 2022 is used as a system memory, a work memory, an image memory, an audio memory, etc., and the constants, variables, and the programs read from the ROM 2021, etc., for the operation of the CPU 2020 are loaded into the RAM 2022. Audio signals input from the microphone 2025 are subjected to gain control to a predetermined level and thereafter converted from analog to digital to form digital audio data. The video data and the audio data are temporarily stored in the RAM 2022.

The CPU 2020 transmits the video data and audio data temporarily stored in the RAM 2022 to the recording section 2026. Recording media 2027 can be inserted and removed in and from the recording section 2026, and the recording section 2026 records the video data and the audio data in the recording media 2027. As the recording media 2027, removal flash memories, such as SD cards, are used.

A temperature detection section 2028 is e.g. a thermistor, and is mounted on the main circuit board 1001. A fan 2029 is operated based on a temperature acquired by the temperature detection section 2028, and draws air into and discharges the same from the inside of the image capturing apparatus body 2001. The rotational state of the fan 2029 is controlled by the CPU 2020. The body operation section 2030 transfers an instruction input by a user's operation to the CPU 2020. The body operation section 2030 includes a body REC button 2031, a power switch 2032, and a body operation button group 2033 (see FIG. 4). An operation sound generated when operating the body operation section 2030, a beep generated when starting or stopping storing of a video, etc., are output from the speaker 2040 under the control of the CPU 2020.

The power supply controller 2041 is comprised of a battery detection circuit, a DC-DC converter, and a switch circuit for switching blocks to be energized, etc., and detects whether or not a battery 2042 is attached, a battery type, and a battery remaining amount. The battery 2042 which supplies electrical power to the image capturing apparatus body 2001 is removably attached to the image capturing apparatus body 2001 and is e.g. a lithium ion battery.

When the grip communication contact portion 2045 of the image capturing apparatus body 2001 and the grip electrical communication contact portion 2081 of the grip unit 2080 are brought into contact with each other to be electrically connected to each other, the CPU 2020 of the image capturing apparatus body 2001 detects attachment of the grip unit 2080. When the grip operation section 2082 of the grip unit 2080 is operated by a user, various instructions from the user are sent to the CPU 2020.

When the lens communication contact portion 2046 of the image capturing apparatus body 2001 and the lens electrical communication contact portion 2101 of the lens barrel 2100 are brought into contact with each other to be electrically connected to each other, the CPU 2020 of the image capturing apparatus body 2001 detects attachment of the lens barrel 2100. When attachment of the lens barrel 2100 is detected, the CPU 2020 reads lens information from the lens memory 2102 and stores the read lens information in the RAM 2022.

When the wireless communication contact portion 2047 of the image capturing apparatus body 2001 and the wireless unit communication contact portion 2201 of the wireless unit 2200 are brought into contact with each other to be electrically connected to each other, the CPU 2020 of the image capturing apparatus body 2001 detects attachment of the wireless unit 2200. When attachment of the wireless unit 2200 is detected, the CPU 2020 transmits video data and audio data stored in the RAM 2022 to the wireless unit 2200. The communication section 2202 of the wireless unit 2200 transmits the video data and audio data sent from the RAM 2022 to an external apparatus (not shown).

When the viewfinder communication contact portion 2048 of the image capturing apparatus body 2001 and the viewfinder unit communication contact portion 2301 of the viewfinder unit 2300 are brought into contact with each other to be electrically connected to each other, the CPU 2020 of the image capturing apparatus body 2001 detects attachment of the viewfinder unit 2300. When attachment of the viewfinder unit 2300 is detected, the CPU 2020 transmits video data stored in the RAM 2022 to the viewfinder unit 2300. The viewfinder display section 2302 of the viewfinder unit 2300 is e.g. a liquid crystal display device, and displays an operating status of the image capturing apparatus body 2001, etc., as on-screen display information, on an as-needed basis.

When the panel communication contact portion 2049 of the image capturing apparatus body 2001 and the panel unit communication contact portion 2501 of the panel unit 2500 are brought into contact with each other to be electrically connected to each other, the CPU 2020 of the image capturing apparatus body 2001 detects attachment of the panel unit 2500. When attachment of the panel unit 2500 is detected, the CPU 2020 transmits video data stored in the RAM 2022 to the panel unit 2500. The panel display section 2502 of the panel unit 2500 is e.g. a liquid crystal display device, and displays an operating status of the image capturing apparatus body 2001, as on-screen display information, on an as-needed basis. Note that the information displayed on the panel display section 2502 and the viewfinder display section 2302 can be made identical or different, by configuration by the user.

In the image capturing system 2000, for example, light received by the image sensor 2010 is converted to digital image data of at least approximately 23 frames per second (fps), and the digital image data is recorded in one of the recording media 2027 by the recording section 2026. The frame rate can be set within a range from approximately 1 fps to approximately 250 fps. For example, the image capturing system 2000 may change the frame rate according to a set resolution. More specifically, a frame rate within a range from approximately 1 fps to approximately 100 fps is set in a "5K" resolution mode, and a frame rate within a range from approximately 1 fps to approximately 125 fps is set in a "4K" resolution mode. A frame rate within a range from approximately 1 fps to approximately 125 fps is set in a Quad HD mode, a frame rate within a range from approximately 1 fps to approximately 160 fps is set in a "3K" resolution mode, and a frame rate within a range from approximately 1 fps to approximately 250 fps is set in a "2K" resolution mode. For example, as the frame rate, 20, 23.976, 24, 30, 60 and 120 fps, or other frame rates between these frame rates, or frame rates not lower than these frame rates may be set.

The image capturing system 2000 can output image data at a resolution of "2K" (such as 16:9 (2048×1152 pixels) and 2:1 (2048×1024 pixels)), a resolution of "3K" (such as 16:9 (3072×1728 pixels) and 2:1 (3072×1536 pixels)), a resolution of "4K" (such as 4096×2540 pixels, 16:9 (4096×2304 pixels), and 2:1 (4096×2048 pixels)), a resolution of "4.5K", a resolution of Quad HD (such as 3840×2160 pixels), a resolution of "5K" (such as 5120×2700 pixels), a resolution of "6K" (such as 6144×3160 pixels), and a resolution of "8K" (such as 7680×4320 pixels), or a resolution higher than 8K. The image capturing system 2000 can be configured to record or output image data having a horizontal resolution at least between any values of the above-mentioned resolutions.

Further, the resolution is at least one of the above-mentioned values (or some value between the above-mentioned values), and can take approximately 6.5K, 7K, 8K, 9K, or 10K, or some value between the above-mentioned values. In the present embodiment, in information expressed in the form of xK (such as the above-mentioned 2K and 4K), the number of "x" refers to an approximate horizontal resolution. Therefore, the resolution of "4K" corresponds to the number of horizontal pixels which is approximately not smaller than 4000, and the resolution of "2K" corresponds to the number of horizontal pixels which is approximately not smaller than 2000.

The image sensor 2010 can be adapted to a size from approximately 0.5 inch (8 mm) to ⅔ inch, S35 for a movie, 35 mm full-frame for a still camera, and up to 645 (medium size). Further, the image sensor 2010 can have sizes of approximately 10.1 mm×5.35 mm, 24.4 mm×13.7 mm, 30 mm×15 mm, 36 mm×24 mm, 56 mm×42 mm, and 186 mm×56 mm. Further, the image sensor 2010 can be configured to provide a variable resolution by selectively outputting only predetermined part of the pixel area. The image sensor 2010 can include e.g. color filters arranged in the Bayer array. Therefore, the image sensor 2010 outputs data indicating an amount of red light, green light, or blue light, detected by each photoelectric conversion element of the image sensor 2010.

Figure 4:
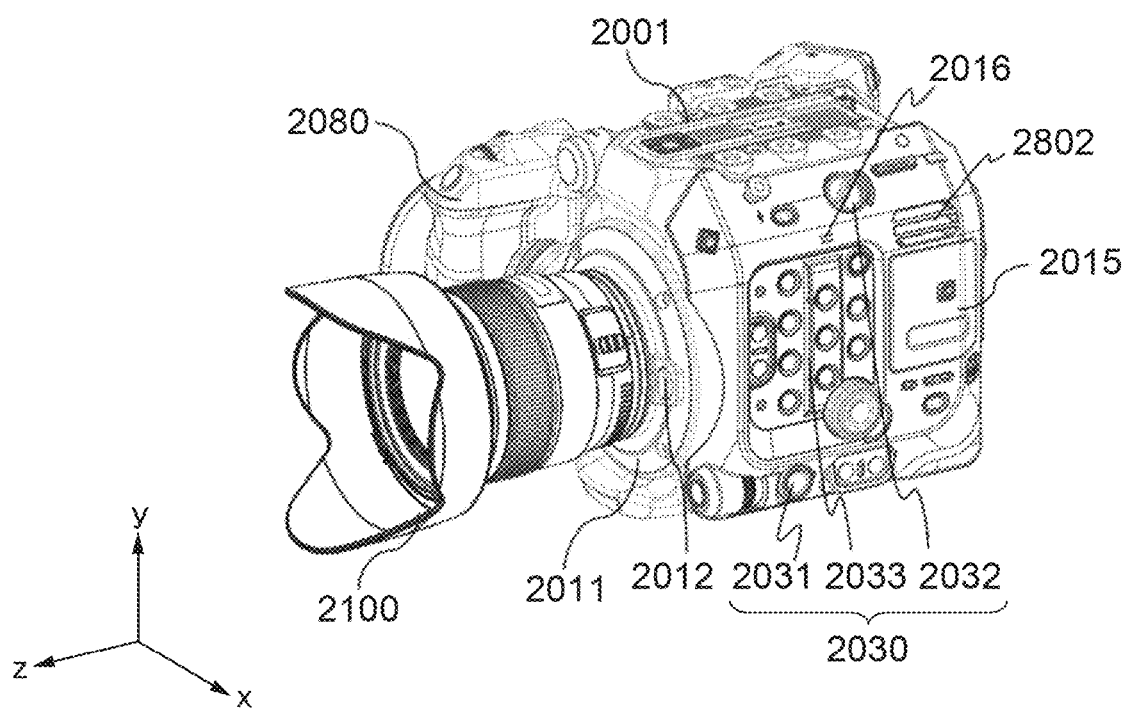
FIG. 4 is a perspective view of an image capturing apparatus body in a state having a grip unit and a lens barrel attached thereto, as viewed obliquely from the front.
Figure 5:
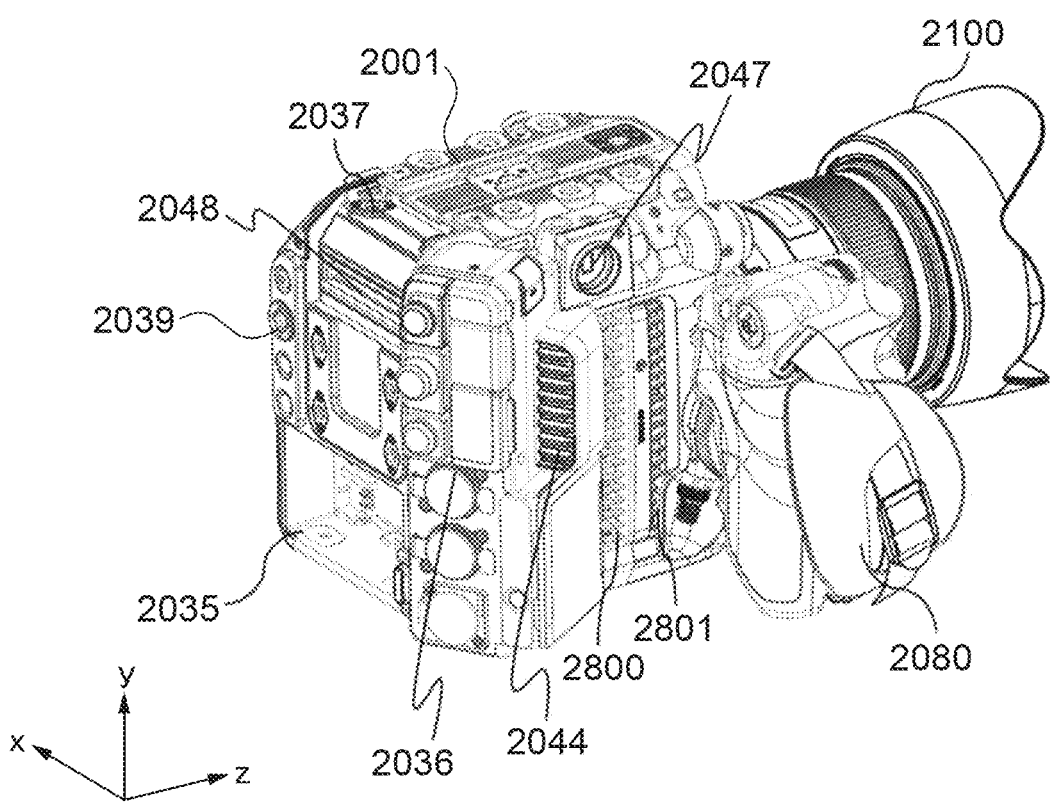
FIG. 5 is a perspective view of the image capturing apparatus body in the state having the grip unit and the lens barrel attached thereto, as viewed obliquely from the rear.
Figure 6:
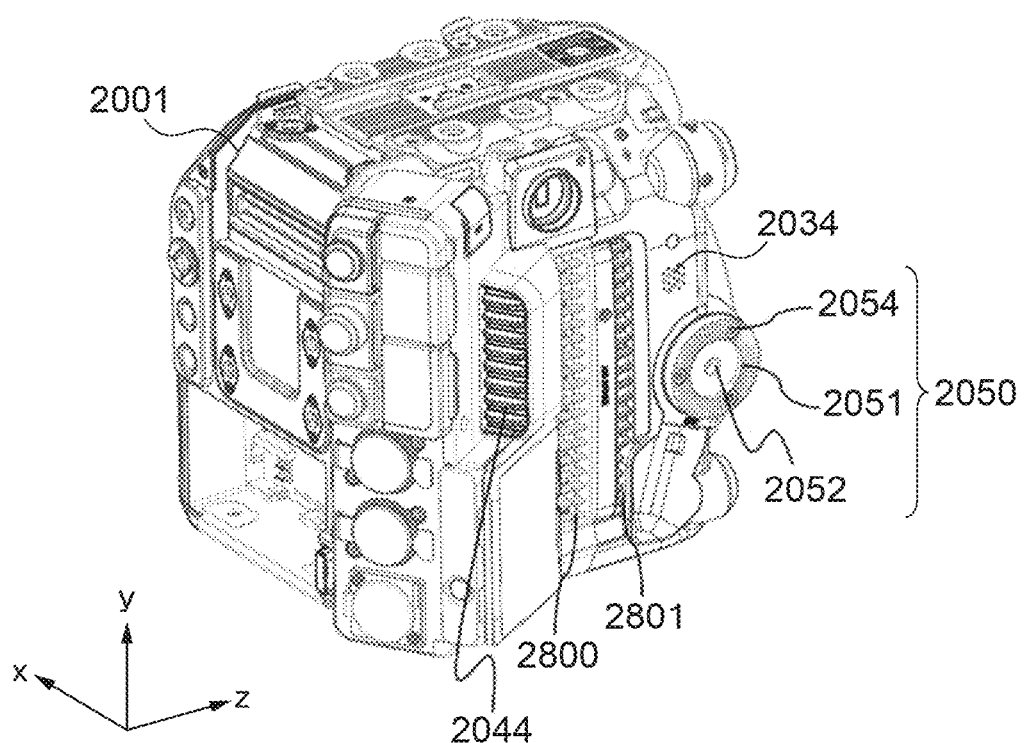
FIG. 6 is a perspective view of the image capturing apparatus body, as viewed obliquely from the rear.

FIG. 4 is a perspective view of the image capturing apparatus body 2001 in a state having the grip unit 2080 and the lens barrel 2100 attached thereto, as viewed obliquely from the front. FIG. 5 is a perspective view of the image capturing apparatus body 2001 in the state having the grip unit 2080 and the lens barrel 2100 attached thereto, as viewed obliquely from the rear. FIG. 6 is a perspective view of the image capturing apparatus body 2001, as viewed obliquely from the rear.

The front side of the image capturing apparatus body 2001 is provided with a lens mount 2011, the lens communication contact portion 2046 (not shown in FIGS. 4 to 6), and a lens release button 2012. The lens barrel 2100 can be mounted on and removed from the lens mount 2011, and the lens release button 2012 is operated when removing the lens barrel 2100 from the lens mount 2011. Although not shown in FIGS. 4 to 6, within the image capturing apparatus body 1001, at respective locations rearward of the lens mount 1010, there are disposed the image sensor 2010, and a sensor circuit board on which the image sensor 2010 is mounted, for converting video signals output from the image sensor 2010 mounted thereon into predetermined data.

The right side of the image capturing apparatus body 2001 as viewed from the front is provided with the body operation section 2030 operated by the user so as to cause the image capturing apparatus body 2001 to execute predetermined operations. The body operation section 2030 includes the body REC button 2031, the power switch 2032, and the body operation button group 2033. Further, the right side is provided with a recording media-accommodating cover 2015 that covers an accommodating chamber for accommodating the recording media 2027, such that the recording media-accommodating cover 2015 can be closed and opened, and microphone holes 2016 for recording sound using the microphone 2025.

The rear side of the image capturing apparatus body 2001 is provided with a battery receiving section 2035 for receiving the battery 2042 therein, and an input/output terminal group 2036 including an external connection terminal and a power supply terminal, etc. Further, the rear side of the image capturing apparatus body 2001 is provided with a fixing portion 2037 for fixing the viewfinder unit 2300, the viewfinder communication contact portion 2048, and a body rear side operation section 2039 as part of the body operation section 2030.

The left side of the image capturing apparatus body 2001 as viewed from the front is formed with a first air inlet port 2800, a second air inlet port 2801, and an air outlet port 2044, and the right side of the image capturing apparatus body 2001 as viewed from the front is formed with a third air inlet port 2802. By driving the fan 2029, outside air is drawn from the first air inlet port 2800, the second air inlet port 2801, and the third air inlet port 2802, into the inside of the image capturing apparatus body 2001, and air heated by heat exchange within the image capturing apparatus body 2001 is discharged from the air outlet port 2044.

Note that when image capturing is performed using the image capturing system 2000, the image capturing system 2000 is placed on the right shoulder of the user, and hence the face of the user is positioned adjacent to the right side of the image capturing apparatus body 2001, as viewed from the front. Here, since the air outlet port 2044 of the image capturing apparatus body 2001 is provided in the left side of the image capturing apparatus body 2001, discharge wind discharged from the image capturing apparatus body 2001 does not blow against the face of the user, and therefore, the user does not become uncomfortable.

Further, the left side of the image capturing apparatus body 2001 as viewed from the front is provided with speaker holes 2034, a body-side attachment mechanism 2050, and the wireless communication contact portion 2047. Sound from the speaker 2040 is output from the speaker holes 2034 to the outside. The wireless communication contact portion 2047 is used for attaching/removing the wireless unit 2200. The body-side attachment mechanism 2050 is used for attaching/removing an accessory, such as the grip unit 2080, and has a body-side attachment member 2051 to which the grip unit 2080 can be attached.

The body-side attachment member 2051 has e.g. a substantially disc-like shape, and includes a body-side screw 2052 provided in the center thereof, for being screwed with a grip-side screw (not shown) of the grip unit 2080. Further, an outer peripheral portion of a surface of the body-side attachment member 2051 is provided with a body-side engagement part to be engaged with a grip-side engagement part (not shown) of the grip unit 2080. The body-side engagement part has a structure in which protruding-shape portions and recessed-shape portions, each formed to radially extend, are arranged around its center at predetermined spaced intervals in a circumferential direction. The grip unit 2080 has the grip-side engagement part having recessed-shape portions and protruding-shape portions similar to those of the body-side engagement part and can be firmly fixed to the image capturing apparatus body 2001 by engaging the body-side engagement part and the grip-side engagement part with each other. Note that the body-side attachment member 2051 is fixed to the image capturing apparatus body 2001 with screws 2054.

Figure 7:
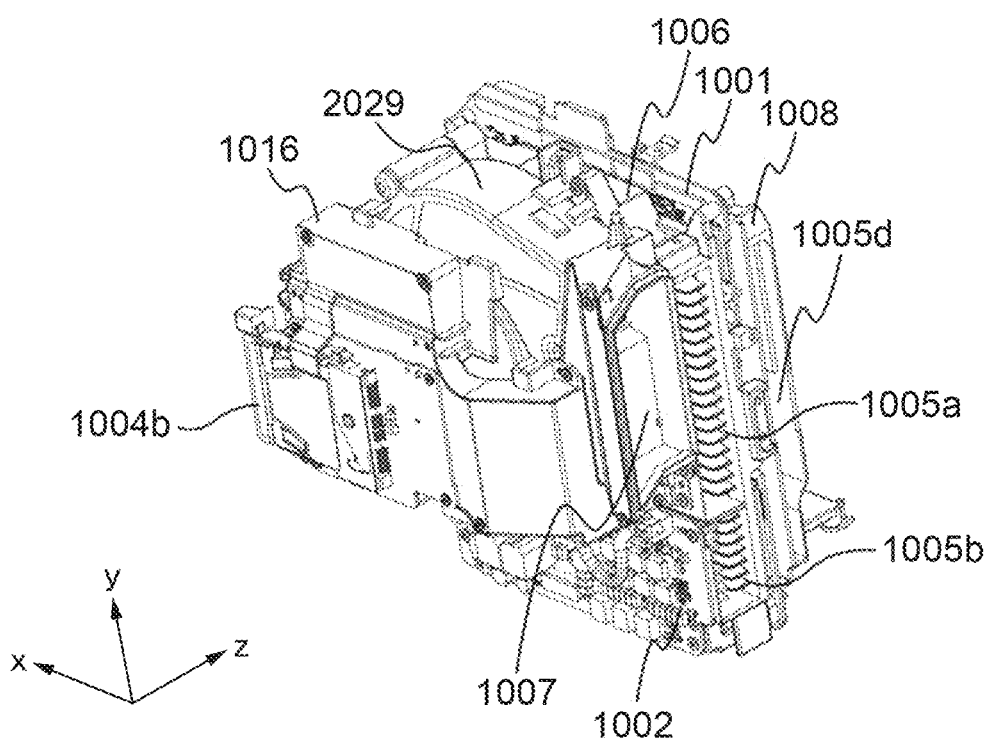
FIG. 7 is a perspective view of heat sources and a heat dissipation structure provided in the image capturing apparatus body, as viewed obliquely from the rear.
Figure 8:
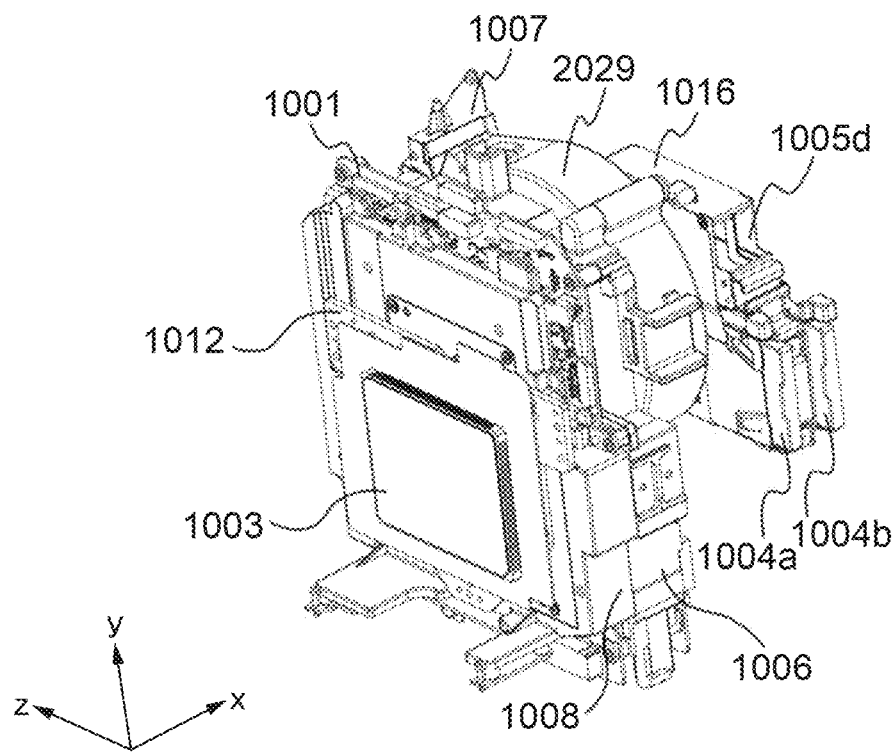
FIG. 8 is a perspective view of the heat sources and the heat dissipation structure provided in the image capturing apparatus body, as viewed obliquely from the front.
Figure 9:
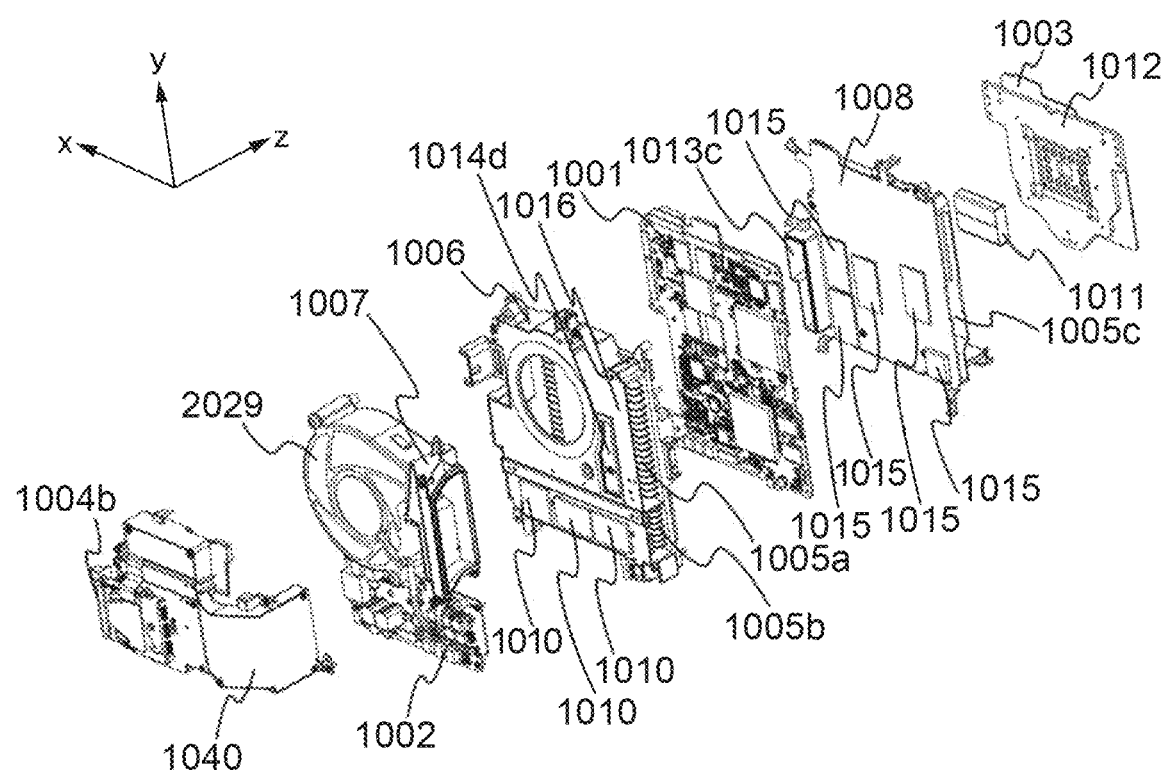
FIG. 9 is an exploded perspective view of the heat dissipation structure in the state shown in FIG. 7.
Figure 10:
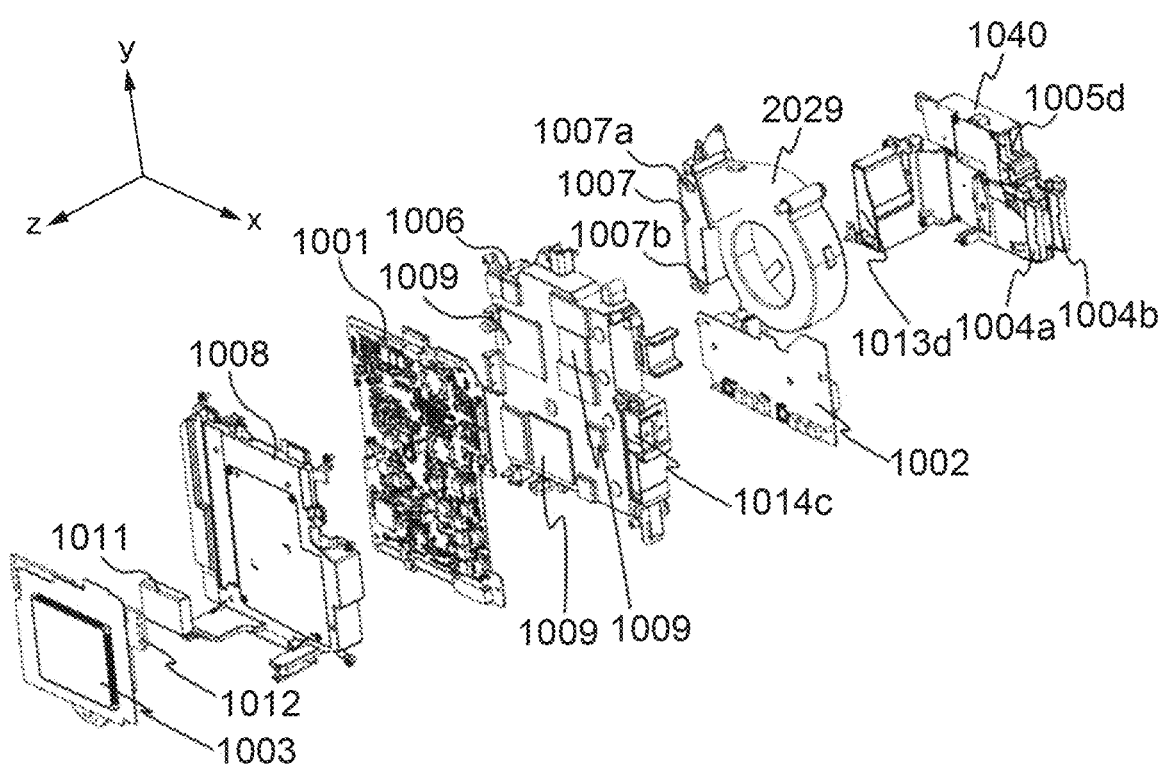
FIG. 10 is an exploded perspective view of the heat dissipation structure in the state shown in FIG. 8.

FIG. 7 is a perspective view of heat sources and a heat dissipation structure provided in the image capturing apparatus body 2001, as viewed obliquely from the rear of the image capturing apparatus body 2001. FIG. 8 is a perspective view of the heat sources and the heat dissipation structure provided in the image capturing apparatus body 2001, as viewed obliquely from the front of the image capturing apparatus body 2001. FIG. 9 is an exploded perspective view of FIG. 7. FIG. 10 is an exploded perspective view of FIG. 8.

In the image capturing apparatus body 2001, increase in internal temperature is suppressed by performing forced cooling using the fan 2029 and ducts. Heat sources to be cooled by forced cooling include the main circuit board 1001 on which the CPU 2020, the ROM 2021, and the RAM 2022 are mounted and the sensor circuit board 1003 on which the image sensor 2010 is mounted. Further, a power supply control circuit board 1002 including the power supply controller 2041, a first medium card 1004a and a second medium card 1004b as specific examples of the recording media 2027 are also heat sources to be cooled by forced cooling.

One surface of the main circuit board 1001 is connected to a main duct unit 1006 via elastic heat transfer members 1009, and heat generated in the main circuit board 1001 is transferred to the main duct unit 1006. Air drawn from the first air inlet port 2800 by the suction force of the fan 2029 flows from an inlet port 1005a into the main duct unit 1006, and the main duct unit 1006 is cooled by heat transfer from the main duct unit 1006 to the air. That is, heat generated in the main circuit board 1001 is transferred to the air flowing in the main duct unit 1006 via the elastic heat transfer members 1009 and the main duct unit 1006, whereby the main circuit board 1001 is cooled and increase in temperature is suppressed.

Further, the power supply control circuit board 1002 is connected to the main duct unit 1006 via elastic heat transfer members 1010, and heat generated in the power supply control circuit board 1002 is transferred to the main duct unit 1006. Air drawn from the first air inlet port 2800 by the suction force of the fan 2029 flows from an inlet port 1005b into the main duct unit 1006, and the main duct unit 1006 is cooled by heat transfer from the main duct unit 1006 to the air. That is, heat generated in the power supply control circuit board 1002 is transferred to the air flowing in the main duct unit 1006 via the elastic heat transfer members 1010 and the main duct unit 1006, whereby the power supply control circuit board 1002 is cooled and increase in temperature is suppressed.

The air heated by flowing through the main duct unit 1006 passes through the fan 2029 and an exhaust duct unit 1007, and then is discharged from the air outlet port 2044 to the outside of the image capturing apparatus body 2001.

The sensor circuit board 1003 is connected to a sensor duct unit 1008 via a sensor plate 1012 and an elastic heat dissipation unit 1011, and heat generated in the sensor circuit board 1003 is transferred to the sensor duct unit 1008. Air drawn from the second air inlet port 2801 by the suction force of the fan 2029 flows from an inlet port 1005c into the sensor duct unit 1008, and the sensor duct unit 1008 is cooled by heat transfer from the sensor duct unit 1008 to the air. That is, heat generated in the sensor circuit board 1003 is transferred to the air flowing in the sensor duct unit 1008, whereby the sensor circuit board 1003 is cooled and increase in temperature is suppressed.

The other surface of the main circuit board 1001 is connected to the sensor duct unit 1008 via elastic heat transfer members 1015. Therefore, the main circuit board 1001 is cooled not only by the main duct unit 1006, but also by heat dissipation via the sensor duct unit 1008, and increase in temperature is suppressed. Air heated by flowing through the sensor duct unit 1008 flows from an outlet port 1013c of the sensor duct unit 1008 into an inflow port 1014c of the main duct unit 1006. The air flowing into the inflow port 1014c of the main duct unit 1006 passes through the fan 2029 and the exhaust duct unit 1007, and then is discharged from the air outlet port 2044 to the outside of the image capturing apparatus body 2001.

Air drawn from the third air inlet port 2802 by the suction force of the fan 2029 flows from an inlet port 1005d to a media duct unit 1040, and the media duct unit 1040 is cooled by heat transfer from the media duct unit 1040 to the air. With this, the first medium card 1004a and the second medium card 1004b mounted on the media duct unit 1040 are cooled, and increase in temperature is suppressed. Air heated by flowing through the media duct unit 1040 flows from an outlet port 1013d of the media duct unit 1040 into an inflow port 1014d of the main duct unit 1006. The air flowing into the inflow port 1014d of the main duct unit 1006 passes through the fan 2029 and the exhaust duct unit 1007, and then is discharged from the air outlet port 2044 to the outside of the image capturing apparatus body 2001.

Figure 11:
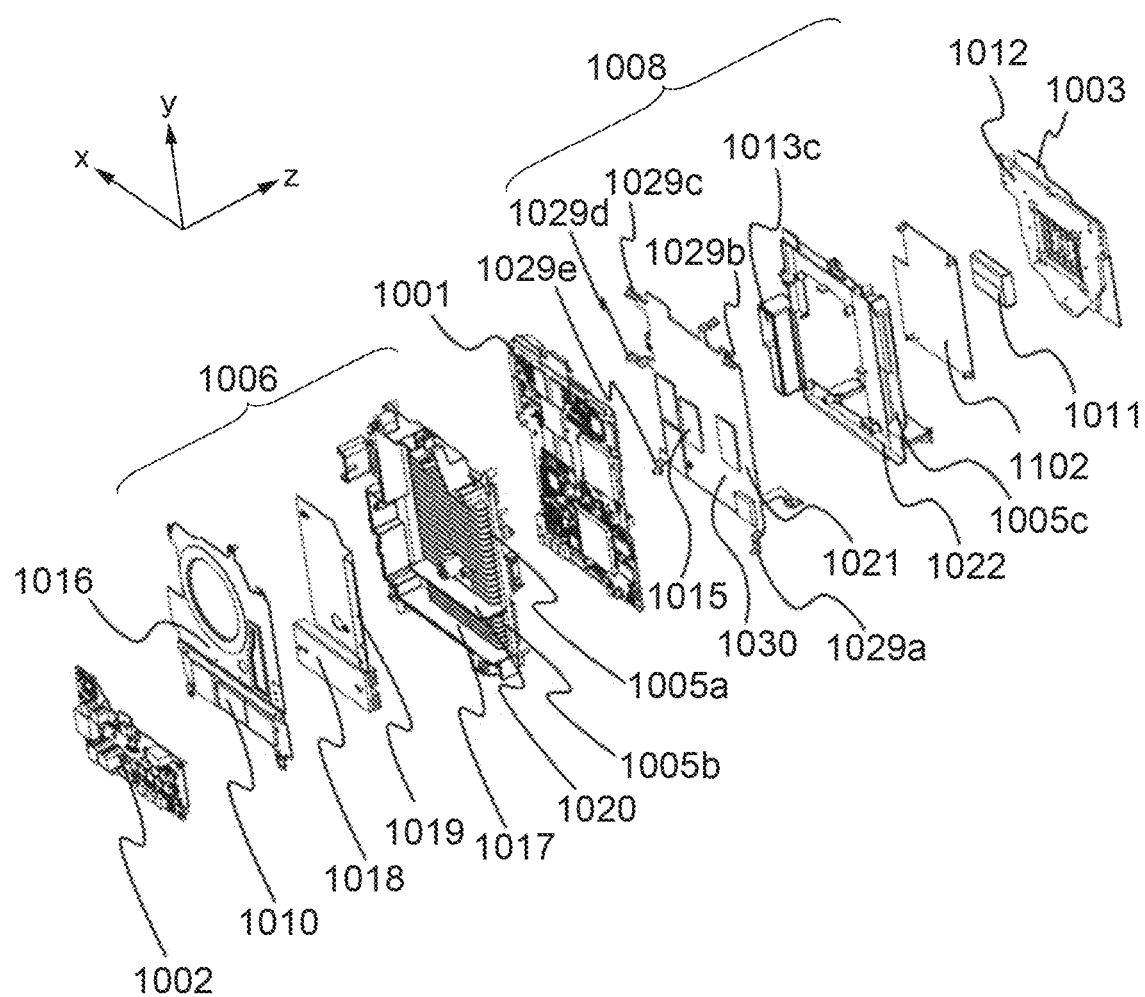
FIG. 11 is an exploded perspective view of the heat dissipation structure shown in FIG. 9, in a further exploded state.
Figure 12:
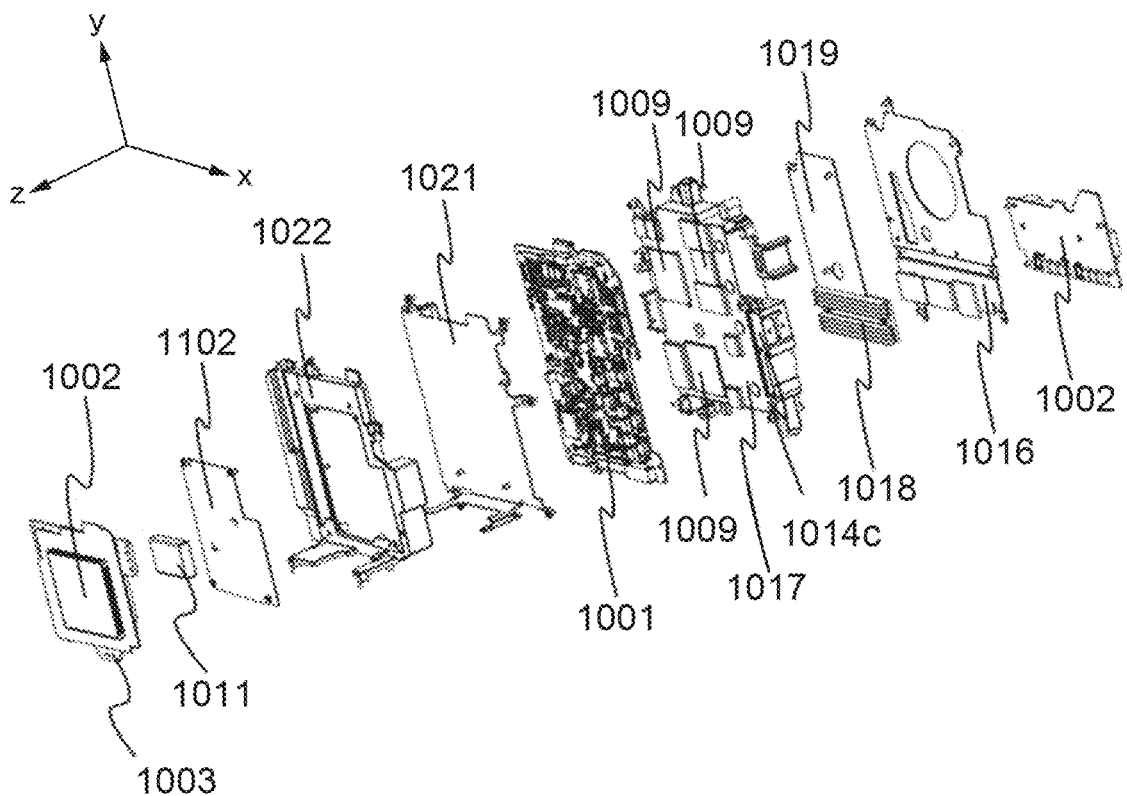
FIG. 12 is an exploded perspective view of the heat dissipation structure shown in FIG. 10, in a further exploded state.

Next, cooling means for the main circuit board 1001 and the sensor circuit board 1003 will be described in more detail. FIG. 11 is an exploded perspective view of the heat sources and the heat dissipation structure shown in FIG. 9, in a state in which the main duct unit 1006 and the sensor duct unit 1008 are further exploded. FIG. 12 is an exploded perspective view of the heat sources and the heat dissipation structure shown in FIG. 10, in a state in which the main duct unit 1006 and the sensor duct unit 1008 are further exploded. Note that in FIGS. 11 and 12, the fan 2029 and the media duct unit 1040 are omitted from illustration.

The main duct unit 1006 includes a main duct plate 1016, a heat sink member 1018, and an air flow passage control plate 1019. The main duct plate 1016 is made of metal. A main duct base member 1017 is made of metal and has a plurality of heat sinks. The heat sink member 1018 is made of metal and improves performance for cooling the power supply control circuit board 1002 by increasing the heat dissipation area. The air flow passage control plate 1019 is formed of metal or resin.

The main duct base member 1017 has a rib portion 1020. The rib portion 1020 functions as a partition wall for spatially separating an air flow passage for causing air drawn in from the inlet port 1005*a* to flow so as to dissipate heat from the main circuit board 1001 and an air flow passage for causing air drawn in from the inlet port 1005*b* to flow so as to dissipate heat from the power supply control circuit board 1002. The air flow passage control plate 1019 causes the air drawn in from the inlet port 1005*a* to flow on the positive z-axis direction side (+z side) of the air flow passage control plate 1019. The negative z-axis direction side (−z side) of the air flow passage control plate 1019 forms an exhaust air flow passage from the outlet port 1013*d* of the media duct unit 1040.

The sensor duct unit 1008 includes a sensor duct plate 1021, a sensor duct base member 1022, and a thermal diffusion plate 1102. The sensor duct plate 1021 and the thermal diffusion plate 1102 are made of metal, and the sensor duct base member 1022 is made of resin or metal. Air drawn in from the inlet port 1005*c* passes through the sensor duct unit 1008 for cooling the main circuit board 1001 and the sensor circuit board 1003, and then flows into the main duct unit 1006 through the outlet port 1013*c* and the inflow port 1014*c*.

Figure 13:
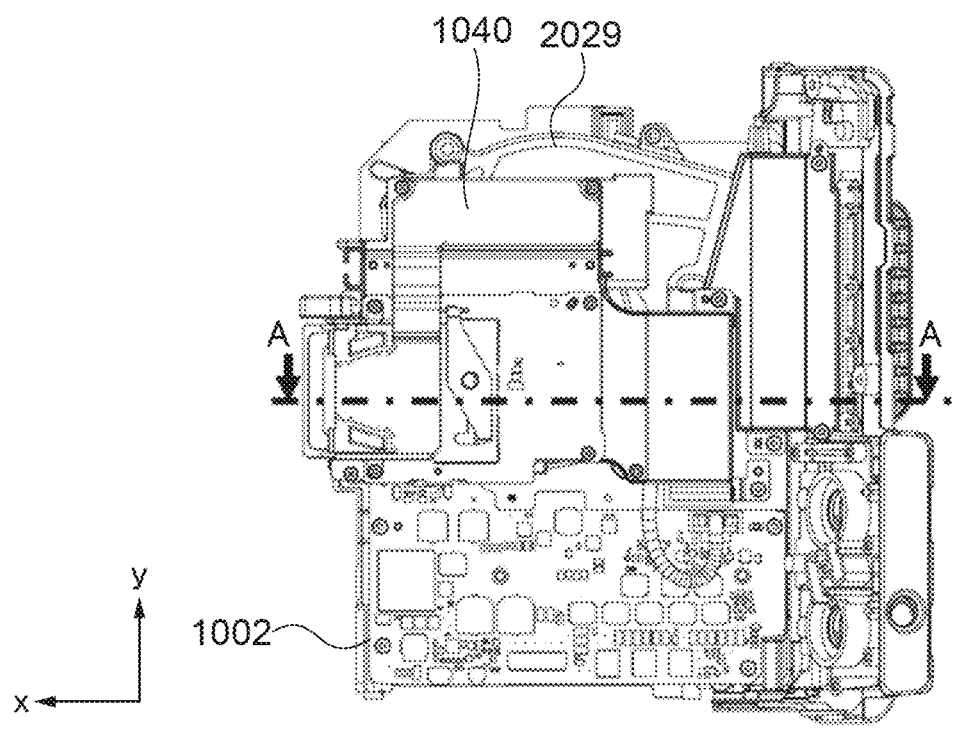
FIG. 13 is a rear view of the heat dissipation structure in the state shown in FIG. 7.
Figure 14:
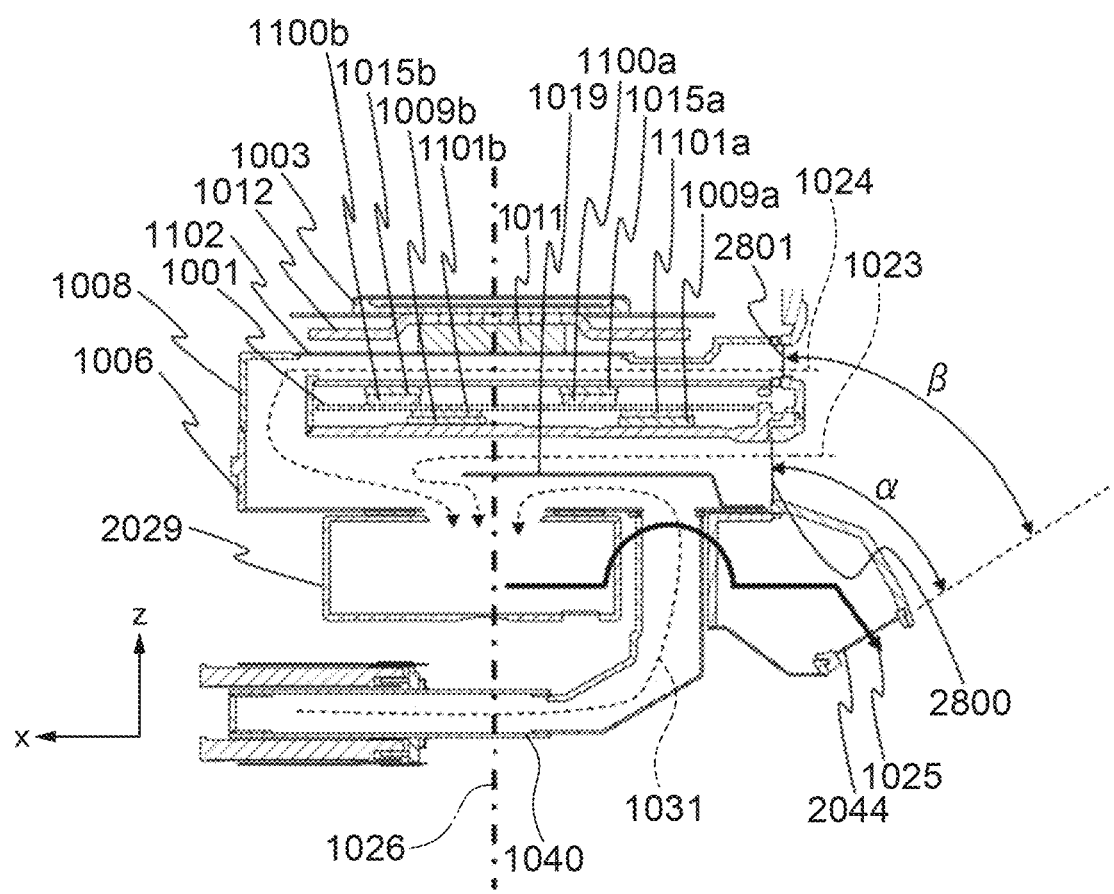
FIG. 14 is a cross-sectional view taken along line A-A in FIG. 13.

FIG. 13 is a rear view of the heat sources and the heat dissipation structure shown in FIG. 7. FIG. 14 is a cross-sectional view taken along A-A in FIG. 13. An air flow passage 1023 indicated by an arrowed broken line shows an air flow passage of air flowing on the +z side of the air flow passage control plate 1019 within the main duct unit 1006, i.e. an air flow passage for cooling the main circuit board 1001. Further, an air flow passage 1024 indicated by an arrowed broken line shows an air flow passage of air flowing through the sensor duct unit 1008 for cooling the sensor circuit board 1003 and the main circuit board 1001. An arrowed solid line 1025 indicates an exhaust air flow passage of air flowing from the fan 2029 to the air outlet port 2044. Note that a one-dot chain line extending in the z-axis direction represents a sensor optical axis 1026 (an axis which extends through the center of an image capturing surface of the image sensor 2010 and is perpendicular to the image capturing surface (image capturing optical axis)).

The air flow passage 1023 extends such that it crosses the sensor optical axis 1026 due to provision of the air flow passage control plate 1019. With this, it is possible to cool an element 1101*a* on the main circuit board 1001 at a location close to the first air inlet port 2800, via a heat dissipation rubber 1009*a*, and further, it is possible to cool an element at a location distant from the first air inlet port 2800, such as an element 1101*b*, via a heat dissipation rubber 1009*b*. Note that the heat dissipation rubbers 1009*a* and 1009*b* are specific examples of the elastic heat transfer members 1009, which are shown as members denoted by respective individual reference numerals.

Similarly, the air flow passage 1024 extends such that it crosses the sensor optical axis 1026 due to provision of the air flow passage control plate 1019. With this, it is possible to cool an element 1100*a* on the main circuit board 1001 at a location close to the second air inlet port 2801, via a heat dissipation rubber 1015*a*, and further, it is possible to cool an element 1100*b* at a location distant from the second air inlet port 2801, via a heat dissipation rubber 1015*b*. Note that the heat dissipation rubbers 1015*a* and 1015*b* are specific examples of the elastic heat transfer members 1015, which are shown as members denoted by respective individual reference numerals. Further, air flows through the whole area of the air flow passage of the heat diffusion plate 1102 of the sensor duct unit 1008 and hence it is possible to more efficiently dissipate heat from the sensor circuit board 1003.

The first air inlet port 2800 and the air outlet port 2044 are not parallel to each other, but have an angle $\alpha$ between them. Further, the second air inlet port 2801 and the air outlet port 2044 are not parallel to each other, either, but have an angle $\beta$ between them. The angle $\alpha$ and the angle $\beta$ are both larger than 0 degree and smaller than 270 degrees. That is, the air outlet port 2044 does not face toward where the first air inlet port 2800 and the second air inlet port 2801 are disposed. With this, it is possible to prevent warm air discharged from the air outlet port 2044 from being drawn in from the first air inlet port 2800 or the second air inlet port 2801 again, and thereby prevent reduction of the cooling capability.

Further, in the image capturing apparatus body 2001, the first air inlet port 2800, the second air inlet port 2801, and the air outlet port 2044, which are main openings, are concentratedly arranged on the negative x-axis direction side (−x side) of the image capturing apparatus body 2001. With this, an operation system, such as the body operation section 2030, and the recording media-accommodating cover 2015 can be arranged on the positive x-axis direction side (+x side) of the image capturing apparatus body 2001, where the user can easily operate these components, and hence it is possible to improve the operability. Note that the air flow passage 1024 extends from the second air inlet port 2801 to the vicinity of the body operation section 2030 (see FIG. 4), i.e. to a side surface of the image capturing apparatus body 2001 which is opposite to the side surface in which the second air inlet port 2801 opens. In view of this, the air flow passage 1023 may be extended to the vicinity of the body operation section 2030 by extending a positive x-axis end of the air flow passage control plate 1019 in the positive x-axis direction.

Figure 15:
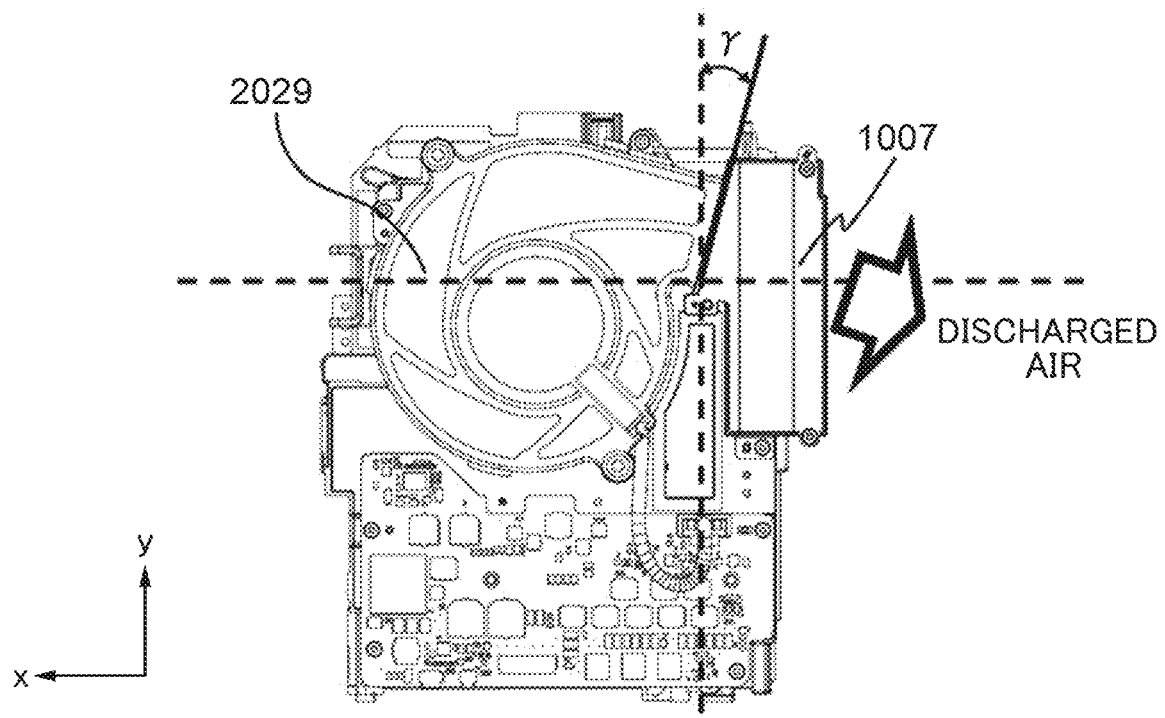
FIG. 15 is a view useful in explaining a direction of mounting a fan on an x-y plane.
Figure 16:
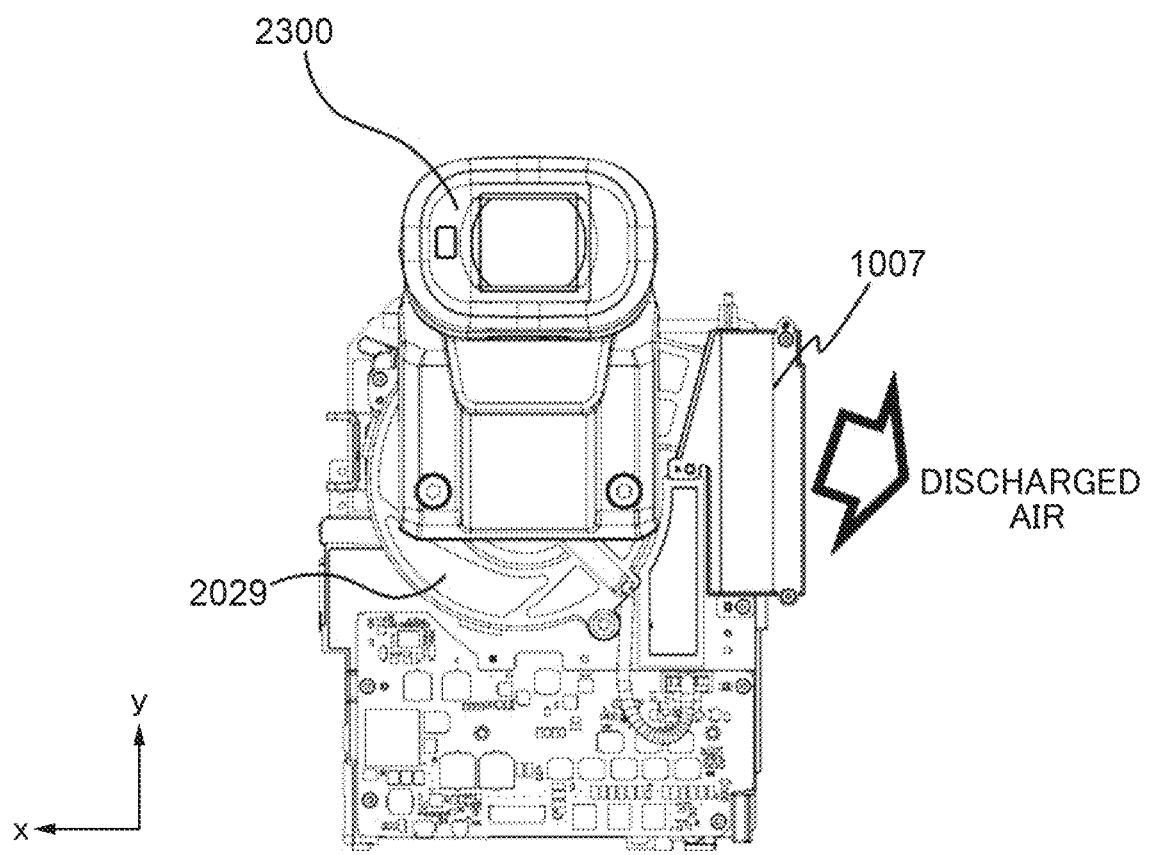
FIG. 16 is a rear view showing FIG. 15 in a state in which a viewfinder unit is overlaid thereon.

FIG. 15 is a view useful in explaining a direction of mounting the fan 2029 on an x-y plane. FIG. 16 is a rear view showing FIG. 15 in a state in which the viewfinder unit 2300 is overlaid thereon. The fan 2029 is mounted on the main duct unit 1006 such that the outlet port 2044 thereof faces obliquely downward with a predetermined angle $\gamma$ with respect to the y-axis With this, it is possible to prevent, when the user uses the viewfinder unit 2300, heated discharge wind from the air outlet port 2044 (see FIG. 5) from blowing against the user's face.

As shown in FIGS. 9 and 10, surfaces 1007*a* and 1007*b* of the exhaust duct unit 1007, which are in contact with the main duct unit 1006, are formed of a resin material, whereas the main duct plate 1016 of the main duct unit 1006, which is in contact with the exhaust duct unit 1007, is made of metal so as to give priority to thermal conductivity. Since the surfaces 1007*a* and 1007*b* are formed of a resin material generally lower in thermal conductivity than metal, it is possible to suppress returning of heat of discharge wind heated within the image capturing apparatus body 2001 to the main duct unit 1006. Note that it is also possible to obtain the same advantageous effect by using a resin material to form one of an inlet side and an outlet side of wall portions that separate the air flow passages extending through the exhaust duct unit 1007 and the main duct unit 1006, in the vicinity of the first air inlet port 2800, the second air inlet port 2801, and the air outlet port 2044.

Figure 17:
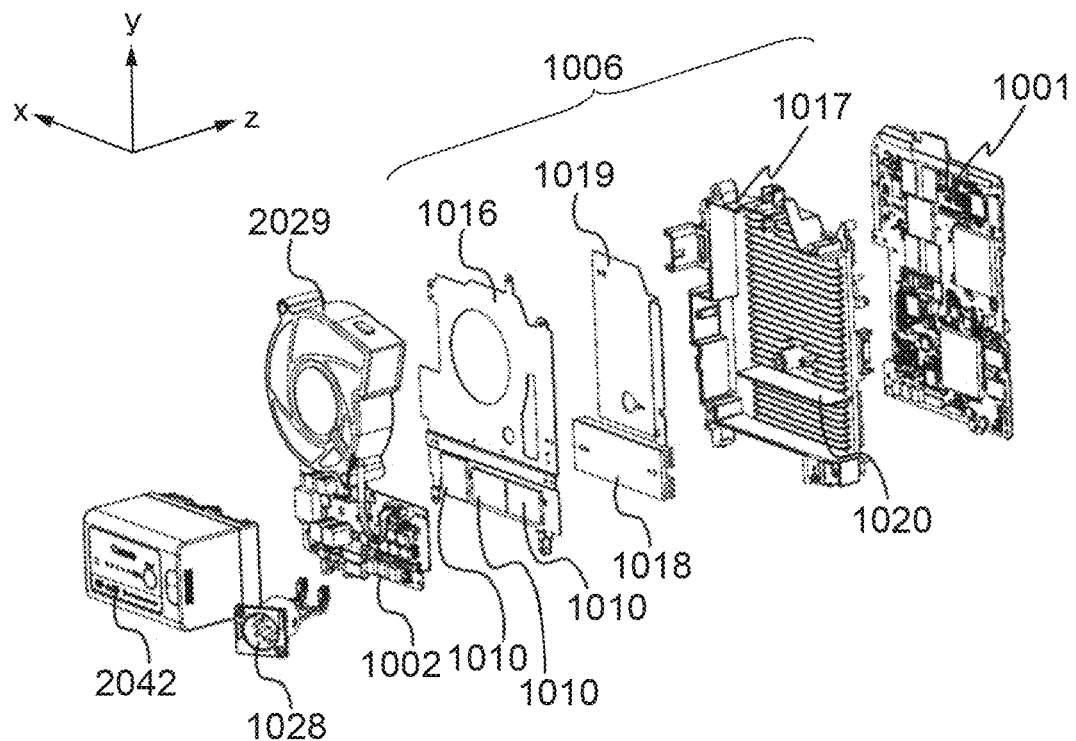
FIG. 17 is an exploded perspective view of a structure including a power supply control circuit board and components in its vicinity.

Next, cooling means for the power supply control circuit board 1002 will be described in more detail. FIG. 17 is an exploded perspective view of a structure including the power supply control circuit board 1002 and components in its vicinity. On the power supply control circuit board 1002, there are mounted the power supply controller 2041 (see FIG. 3), the battery detection circuit, the DC-DC converter, and the switch circuit for switching a block to be energized, etc. The fan 2029 is connected to the main duct unit 1006. Further, the power supply control circuit board 1002 is disposed on the negative y-axis direction side (−y side) of the fan 2029, and is thermally connected to the main duct unit 1006. That is, the fan 2029 and the power supply control circuit board 1002 are mounted on the same surface (main duct plate 1016) of the main duct unit 1006.

The elastic heat transfer members 1010 are sandwiched and held between the power supply control circuit board 1002 and the main duct unit 1006. Further, on a surface of the main duct unit 1006, opposite from the power supply control circuit board 1002, the heat sink member 1018 is fixed. When air is caused to flow through the main duct unit 1006 by the fan 2029, the power supply control circuit board 1002 is cooled by the heat sink member 1018, the sensor duct plate 1021, and the elastic heat transfer members 1010.

The image capturing apparatus body 2001 can be reduced in size by disposing the power supply control circuit board 1002 in a free space on the negative y-axis direction side of the fan 2029. Further, the power supply control circuit board 1002 can be cooled by connecting the power supply control circuit board 1002 to the main duct unit 1006 via the elastic heat transfer members 1010. Note that the main duct unit 1006 is the largest metallic member in the image capturing apparatus body 2001 and serves as an electrical ground (GND). Therefore, by bringing the power supply control circuit board 1002 into direct contact with the main duct unit 1006, it is possible to reduce unnecessary noise generated from the power supply control circuit board 1002.

Figure 18:
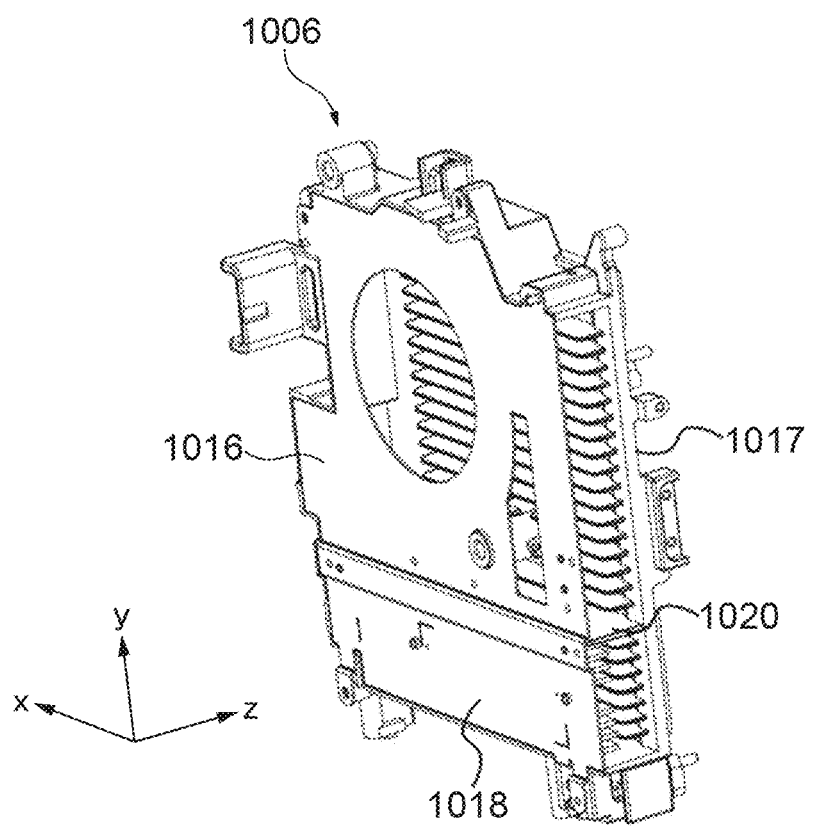
FIG. 18 is a partial perspective view of a main duct unit.

FIG. 18 is a partial perspective view of the main duct unit 1006, showing a positional relationship between the main duct base member 1017, the main duct plate 1016, and the heat sink member 1018. The air flow passage for cooling the power supply control circuit board 1002 is made separate from the other cooling passages by the rib portion 1020 provided on the main duct base member 1017 and the main duct plate 1016.

Figure 19:
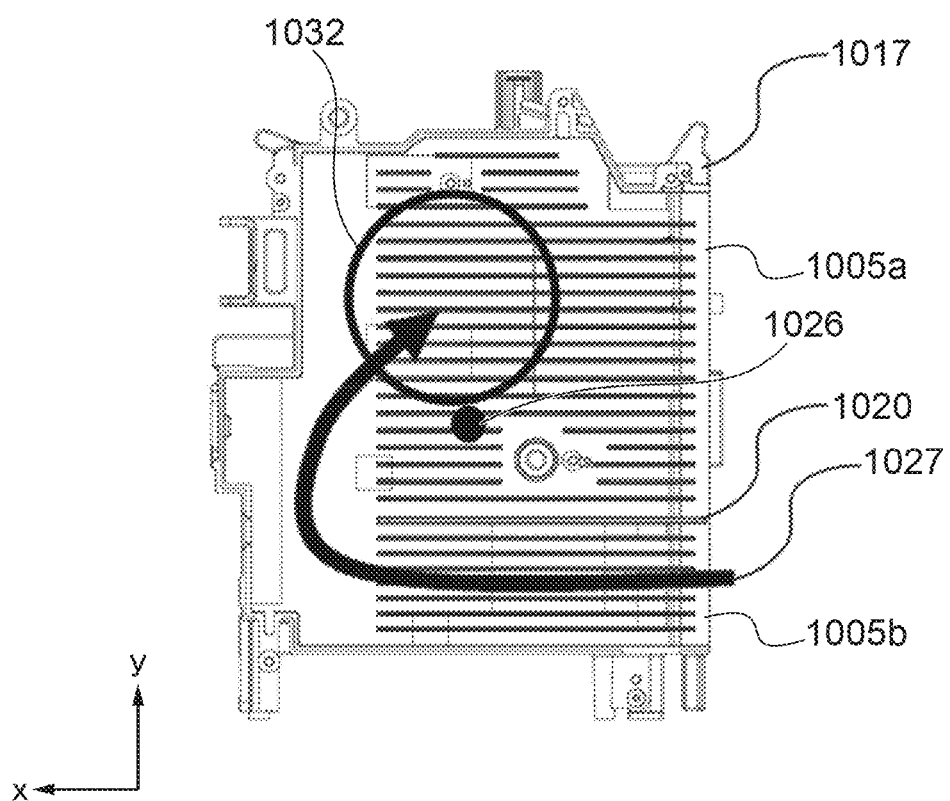
FIG. 19 is a view useful in explaining an air flow passage for cooling the power supply control circuit board.

FIG. 19 is a view useful in explaining an air flow passage 1027 for cooling the power supply control circuit board 1002. A circle indicated by a solid line in FIG. 19 represents a fan opening 1032 as an air inlet port of the fan 2029. The air flow passage 1027 is formed at a location not overlapping the fan opening 1032 (distant from the fan opening 1032) such that the air flow passage 1027 overlaps the substantially whole area of the power supply control circuit board 1002 as viewed from the direction of the sensor optical axis 1026. Therefore, air flowing in from the inlet port 1005*b* flows through the air flow passage 1027 along the longitudinal direction (x-axis direction) of the power supply control circuit board 1002 due to provision of the rib portion 1020, and then flows toward the fan opening 1032. Thus, the rib portion 1020 makes it possible to cause air from the inlet port 1005*b* to flow to the opposite side (the positive x-axis direction side) of the main duct unit 1006 from the inlet port 1005*b*, and hence it is possible to enhance the cooling efficiency of the power supply control circuit board 1002.

Figure 20:
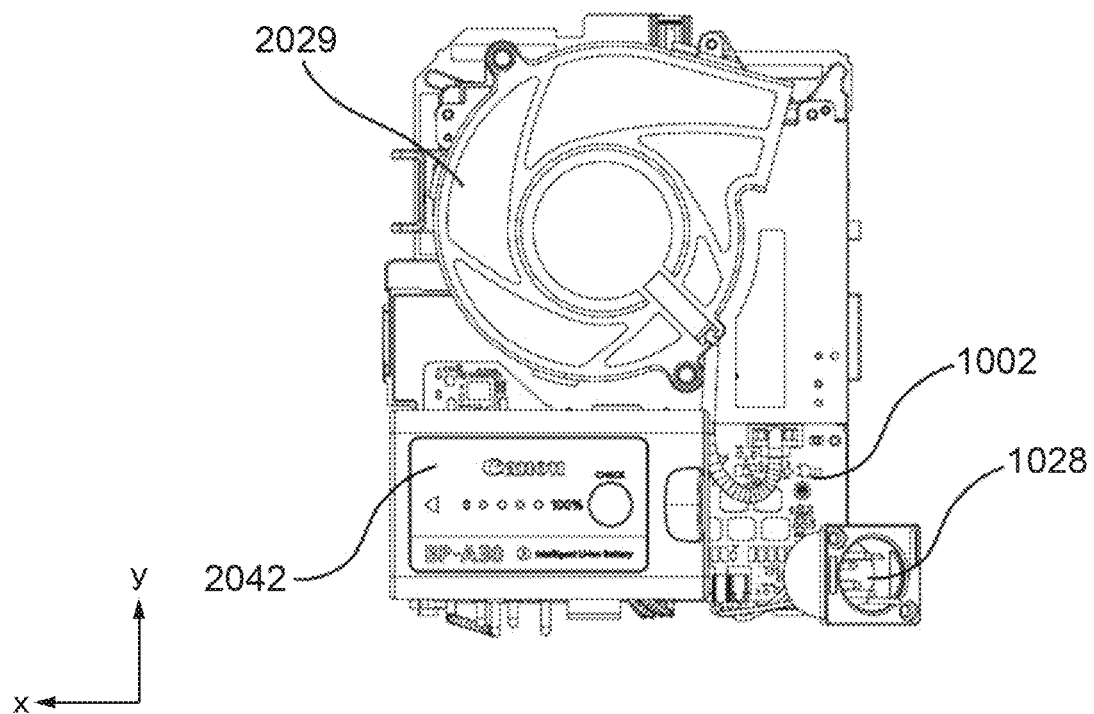
FIG. 20 is a rear view showing a positional relationship between a battery, a power supply jack, and the power supply control circuit board.

FIG. 20 is a rear view showing a positional relationship between the battery 2042, a power supply jack 1028, and the power supply control circuit board 1002. The battery 2042 is disposed at a location overlapping the power supply control circuit board 1002 as viewed in a direction along the sensor optical axis 1026. With this, it is possible to reduce a distance between the battery 2042 and the power supply control circuit board 1002, and thereby reduce loss of power supply, caused by resistance. Further, the power supply control circuit board 1002 and the power supply jack 1028 are arranged at respective locations overlapping each other as viewed in a direction along the sensor optical axis 1026. With this, it is possible to reduce a distance between the power supply control circuit board 1002 and the power supply jack 1028, and thereby reduce loss of power supply, caused by resistance.

Next, a connection structure of the main duct unit 1006, the main circuit board 1001, and the sensor duct unit 1008 will be described in detail with reference to FIGS. 9, 11, and 12. The main duct unit 1006 and the sensor duct unit 1008 are fastened together (co-fastened), in a state in which the main circuit board 1001 is held therebetween, using at least three or more screws.

Here, the elastic heat transfer members 1009 are sandwiched and held between the main circuit board 1001 and the main duct unit 1006, and the elastic heat transfer members 1015 are sandwiched and held between the main circuit board 1001 and the sensor duct unit 1008. In a case where power consumption of the main circuit board 1001 increases as the functionality and performance of the image capturing apparatus body 2001 are made higher, it is necessary to provide measures, such as increase in the number of the elastic heat transfer members 1009 and 1015 and/or increase in the hardness of the elastic heat transfer members 1009 and 1015 so as to enhance thermal conductivity. In this case, stress applied from the elastic heat transfer members 1009 and 1015 to the main circuit board 1001 is increased.

To cope with this problem, in the image capturing apparatus body 2001, as mentioned above, the main duct unit 1006 and the sensor duct unit 1008 hold the main circuit board 1001 as a heat dissipation target therebetween and are fastened together. With this, it is possible to reduce variation in assembly of each of the main duct unit 1006 and the sensor duct unit 1008 to the main circuit board 1001 and reduce variation in the assembled state, caused by dimensional tolerances of the components. This makes it possible to reduce stress applied to the main circuit board 1001 even when the number and/or the hardness of the elastic heat transfer members 1009 and 1015 is/are increased.

Further, in the image capturing apparatus body 2001, power consumption of components on a surface on the negative z-axis direction side of the main circuit board 100 is larger than that of components on a surface on the positive z-axis direction side of the same. For this reason, the main duct base member 1017 of the main duct unit 1006 is formed of a metallic material having high rigidity and large heat capacity (more specifically, aluminum die-casting material). On the other hand, the sensor duct plate 1021 of the sensor duct unit 1008 is formed of a material having a lower rigidity (more specifically, sheet metal made of aluminum). Here, fastening arm portions 1029*a* to 1029*e* of the sensor duct plate 1021, fastened to the main duct unit 1006, are each formed to be thin and extend from a heat dissipation surface 1030 of the sensor duct plate 1021 in the negative z-axis direction. Therefore, in a case where stress of a certain level or higher is applied from the elastic heat transfer members 1009 and 1015 to the main circuit board 1001, the fastening arm portions 1029a to 1029e are deformed, whereby it is possible to reduce the stress applied to the main circuit board 1001.

Note that comparing the elastic heat dissipation unit 1011 and the elastic heat transfer members 1015 affixed to the sensor duct unit 1008, the elastic heat dissipation unit 1011 is lower in hardness. For this reason, when an external force is applied to the image capturing apparatus body 2001 e.g. due to falling of the image capturing system 2000, an impact transferred to the sensor plate 1012 is eased by the elastic heat dissipation unit 1011, and hence it is possible to obtain an advantageous effect that flange focal length (FFL) shift can be reduced.

Figure 21:
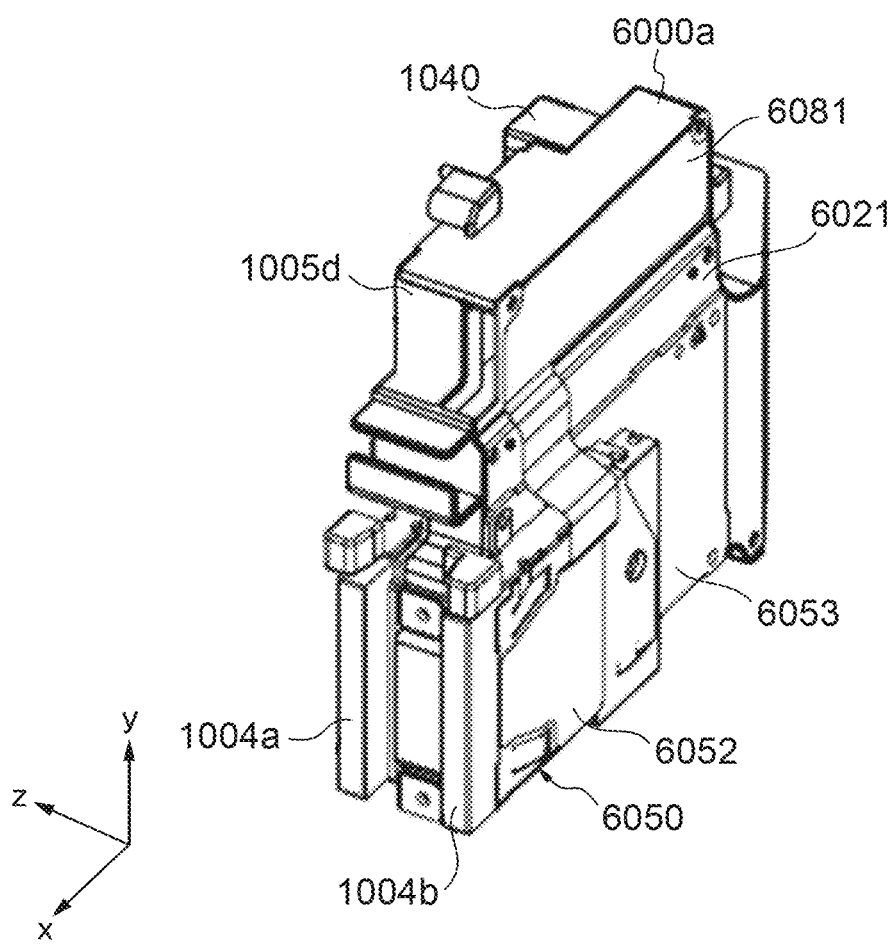
FIG. 21 is a perspective view of a media duct unit, as viewed obliquely from the rear.
Figure 22:
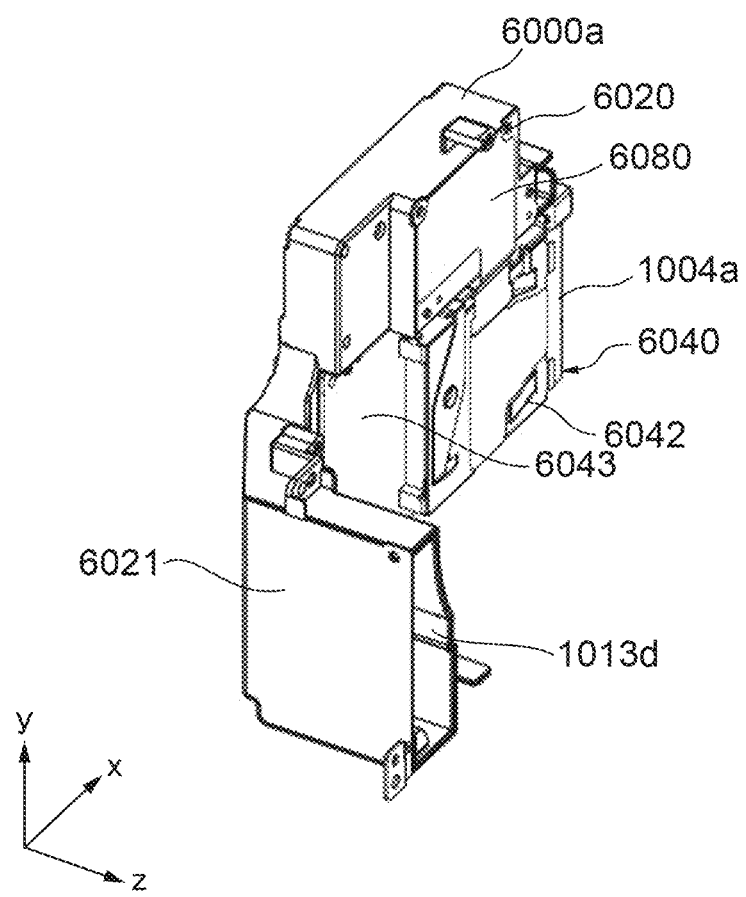
FIG. 22 is a perspective view of the media duct unit, as viewed obliquely from the front.
Figure 23:
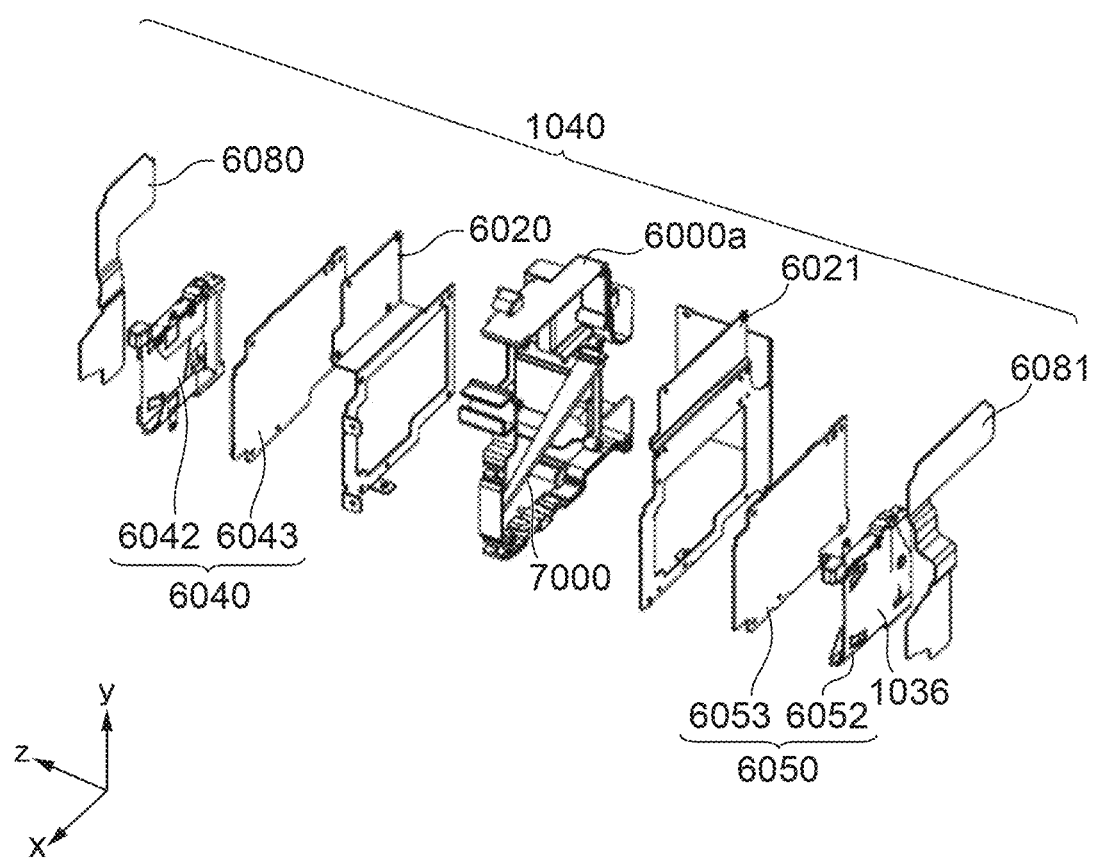
FIG. 23 is an exploded perspective view of the media duct unit in the state shown in FIG. 21.
Figure 24:
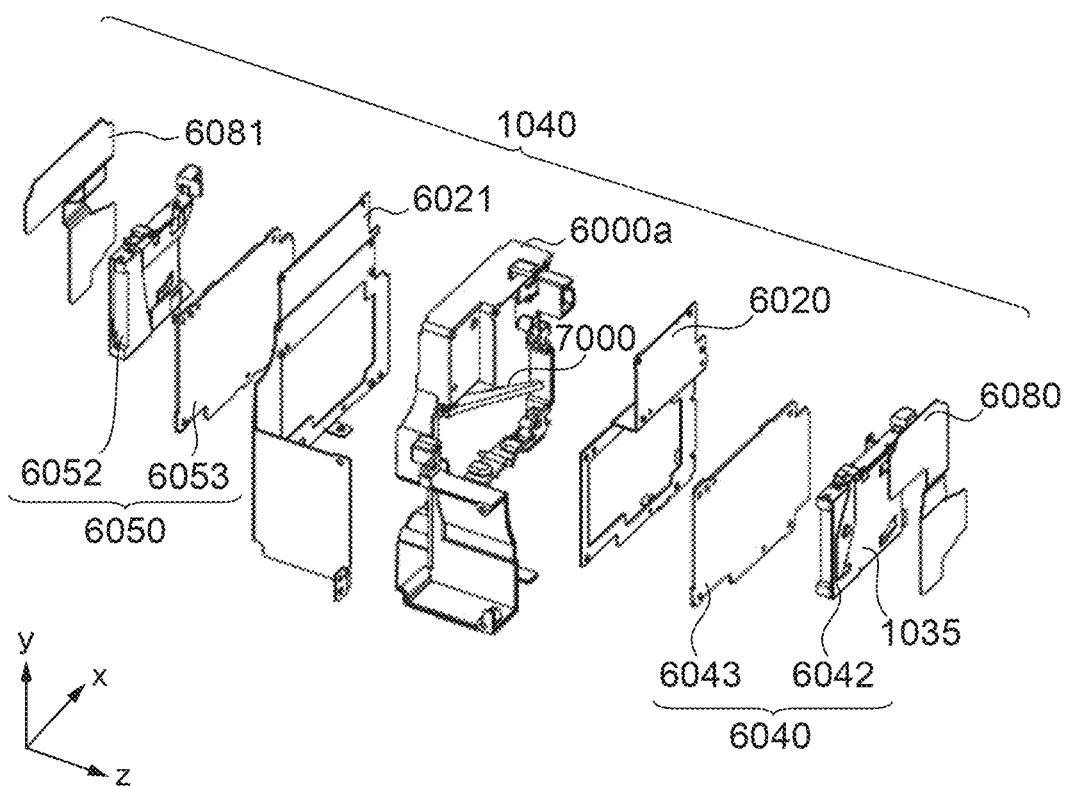
FIG. 24 is an exploded perspective view of the media duct unit in the state shown in FIG. 22.
Figure 25:
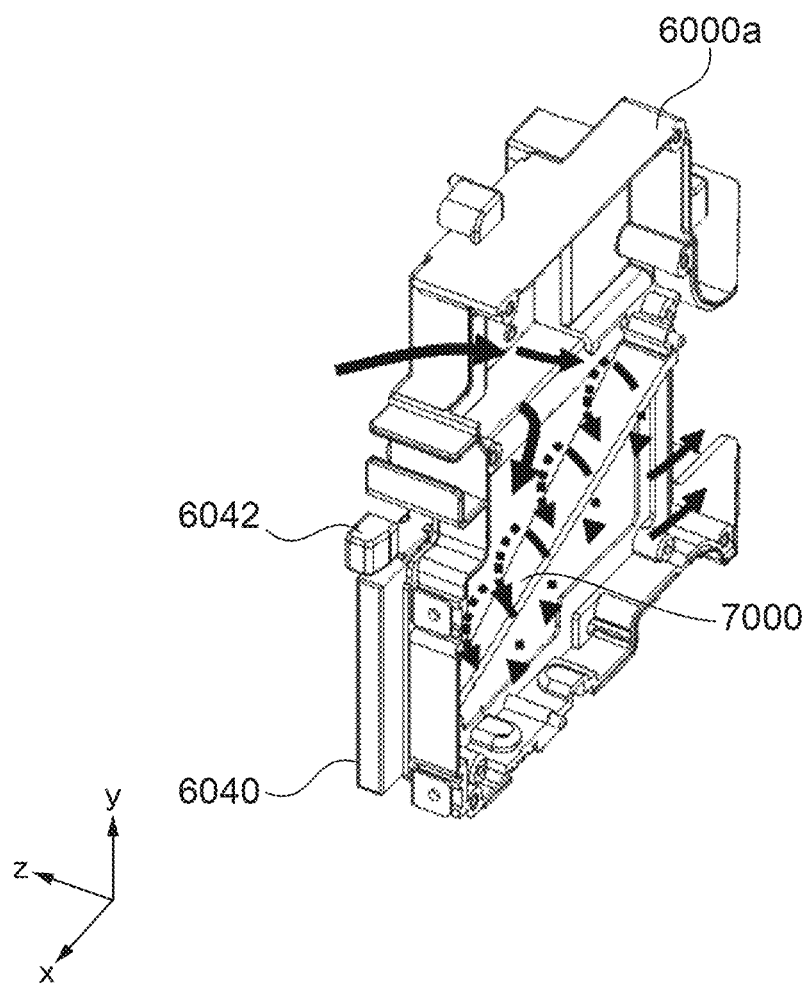
FIG. 25 is a view useful in explaining a flow of air in the media duct unit.

Next, the construction and heat dissipation structure of the media duct unit 1040 will be described in detail. FIG. 21 is a perspective view of the media duct unit 1040, as viewed obliquely from the rear. FIG. 22 is a perspective view of the media duct unit 1040, as viewed obliquely from the front. FIG. 23 is an exploded perspective view of the media duct unit 1040 shown in FIG. 21 and FIG. 24 is an exploded perspective view of the media duct unit 1040 shown in FIG. 22. Note that FIGS. 21 and 22 show a state in which the first medium card 1004a and the second medium card 1004b are inserted, and FIGS. 23 and 24 show a state in which the first medium card 1004a and the second medium card 1004b are removed. FIG. 25 is a view useful in explaining a flow of air in the media duct unit 1040 and shows a state in which a second medium unit 6050 is removed for convenience of explanation.

A first medium unit 6040 is formed of metal or resin and is fixed to a first duct plate 6020 as a component of the media duct unit 1040. The second medium unit 6050 is formed of metal or resin and is fixed to a second duct plate 6021 as a component of the media duct unit 1040. The first duct plate 6020 and the second duct plate 6021 each have at least one flat portion formed with an opening.

The first medium unit 6040 includes a first medium substrate 6043 and a first medium-holding case 6042 as a holding member for holding the first medium card 1004a. The first medium-holding case 6042 is formed of metal and is fixed to the first medium substrate 6043 by soldering. A front-side surface (surface on the positive z-axis direction side) 1035 of the first medium-holding case 6042 is formed to be flat and is substantially parallel to the first medium substrate 6043.

The second medium unit 6050 includes a second medium substrate 6053 and a second medium-holding case 6052 as a holding member for holding the second medium card 1004b. The second medium-holding case 6052 is formed of metal and is fixed to the second medium substrate 6053 by soldering. A rear-side surface (surface on the negative z-axis direction side) 1036 of the second medium-holding case 6052 is formed to be flat and is substantially parallel to the second medium substrate 6053.

The media duct unit 1040 includes a medium duct frame 6000a formed of resin. To the medium duct frame 6000a, the first duct plate 6020 to which the first medium unit 6040 is fixed and the second duct plate 6021 to which the second medium unit 6050 is fixed are fixed to form wall surfaces. With this, the media duct unit 1040 has a ventilation passage formed therethrough which communicates the inlet port 1005d and the outlet port 1013d, and causes air to flow in and out only via the inlet port 1005d and the outlet port 1013d (hereinafter referred to as the "medium duct ventilation passage").

Note that non-mounting surfaces of the first medium substrate 6043 and the second medium substrate 6053 are exposed from the openings of the first duct plate 6020 and the second duct plate 6021 to the medium duct ventilation passage, to thereby form part of the wall surfaces of the medium duct ventilation passage.

The front-side surface 1035 of the first medium-holding case 6042 connected to the first medium substrate 6043 and a portion of the first duct plate 6020 in the vicinity of the inlet port 1005d are connected by a first heat conductive member 6080 formed of a material having high thermal conductivity. Similarly, the rear-side surface 1036 of the second medium-holding case 6052 connected to the second medium substrate 6053 and a portion of the second duct plate 6021 in the vicinity of the inlet port 1005d are connected by a second heat conductive member 6081 formed of a material having high thermal conductivity. For the first heat conductive member 6080 and the second heat conductive member 6081, it is possible to use, for example, a graphite sheet and a copper sheet (metallic sheet), heat dissipation rubber, a heat dissipation sheet, heat dissipation gel, a heat pipe, etc.

The medium duct frame 6000a has a rib-shaped member 7000. The rig-shaped member 7000 extends from toward the outlet port 1013d of the medium duct ventilation passage with a predetermined angle, and crosses the air flow passage extending from the inlet port 1005d to the outlet port 1013d.

Heat generated in the first medium card 1004a is transferred to the first duct plate 6020 via the first medium-holding case 6042 and the first medium substrate 6043. The heat transferred to the first medium-holding case 6042 is transferred to the first duct plate 6020 via the first heat conductive member 6080. The heat transferred to the first duct plate 6020 is transferred to air flowing through the medium duct ventilation passage. Heat generated in the second medium card 1004b is transferred to the second duct plate 6021 via the second medium-holding case 6052 and the second medium substrate 6053. The heat transferred to the second medium-holding case 6052 is transferred to the second duct plate 6021 via the second heat conductive member 6081. The heat transferred to the second duct plate 6021 is transferred to the air flowing through the medium duct ventilation passage.

The inlet port 1005d and the outlet port 1013d are formed at substantially diagonal positions in the medium duct frame 6000a. Air flowing in from the inlet port 1005d passes through the medium duct ventilation passage, flows to the outlet port 1013d, and then is discharged. In the medium duct ventilation passage, a distance from the inlet port 1005d to the outlet port 1013d, through which air flows, is increased by the rig-shaped member 7000, and an area in which air is brought into contact with the first medium substrate 6043 and the second medium substrate 6053 exposed to the medium duct ventilation passage is increased. This makes it possible to more effectively transfer heat generated from the first medium card 1004a and the second medium card 1004b to air to thereby dissipate the heat.

In FIG. 25, arrows solid lines each represent a stream of air which flows in and flows out, arrowed broken lines each represent a stream of air between the first medium substrate 6043 and the rib-shaped member 7000, and arrowed one-dot-chain line each represent a stream of air between the second medium substrate 6053 and the rib-shaped member 7000. The rib-shaped member 7000 is formed into a shape which is reduced in width as it extends farther from the outlet port 1013d in the x-axis direction. With this, the air flow passages between the wall surfaces of the medium duct frame 6000a and the rib-shaped member 7000 become wider to make air easier to flow, as it extends farther from the outlet port 1013d, whereby it is possible to cause air to flow through the entire inside of the medium duct frame 6000a. Further, since the area of portions of the first medium substrate 6043 and the second medium substrate 6053, which are exposed to the medium duct ventilation passage and hence with which air is brought into contact, is increased, it is possible to more effectively transfer heat generated in the first medium card 1004a and the second medium card 1004b to the air, and thereby dissipate the heat.

Heat transferred from the first medium-holding case 6042 to the first duct plate 6020 via the first heat conductive member 6080 is transferred to air in the medium duct ventilation passage. Heat transferred from the second medium-holding case 6052 to the second duct plate 6021 via the second heat conductive member 6081 is transferred to air in the medium duct ventilation passage. The first duct plate 6020 and the second duct plate 6021 in the vicinity of the inlet port 1005d are the lowest in temperature within the medium duct ventilation passage, and hence it is possible to effectively transfer heat generated in the first medium card 1004a and the second medium card 1004b to air.

Further, the first duct plate 6020 and the second duct plate 6021 are formed of an electrically conductive material, and are fastened to the main duct unit 1006 formed of an electrically conductive material. Therefore, it is possible to hold the first medium unit 6040 and the second medium unit 6050 using the three components of the first duct plate 6020, the second duct plate 6021, and the medium duct frame 6000a. The first medium unit 6040 and the second medium unit 6050, and the main duct unit 1006 can be simultaneously electrically connected by these three components. Further, the first medium card 1004a and the second medium card 1004b can be simultaneously cooled by these three components.

Next, a flow of air from the media duct unit 1040 to the main duct unit 1006, generated by driving the fan 2029, will be described with reference to FIGS. 13 and 14. An air flow passage 1031 indicated by an arrowed broken line in FIG. 14 indicates an air flow passage through which air is caused to flow from the media duct unit 1040 into the fan 2029 via the main duct unit 1006 by driving the fan 2029.

In the main duct unit 1006, the air flow passage 1031 extends on the negative z-axis direction side of the air flow passage control plate 1019. An amount of air flowing through the media duct unit 1040 to cool the first medium card 1004a and the second medium card 1004b is less than an amount of air flowing through the main duct unit 1006 to cool the main circuit board 1001 and the power supply control circuit board 1002. Here, assuming that the air flow passage control plate 1019 is not provided, a weak flow of air in the air flow passage 1031 is prevented by a strong flow of air in the air flow passage 1023 from sufficiently flowing into the fan 2029. To prevent this problem, the air flow passage 1031 and the air flow passage 1023 are formed in the main duct unit 1006 such that they are separated from each other by the air flow passage control plate 1019. As a result, it is possible to supply air necessary for cooling the first medium card 1004a and the second medium card 1004b into the media duct unit 1040.

Next, a media duct unit 1050 as a variation of the media duct unit 1040 will be described. Note that the same components of the media duct unit 1050 as those of the above-described media duct unit 1040 are described using the same reference numerals.

Figure 26:
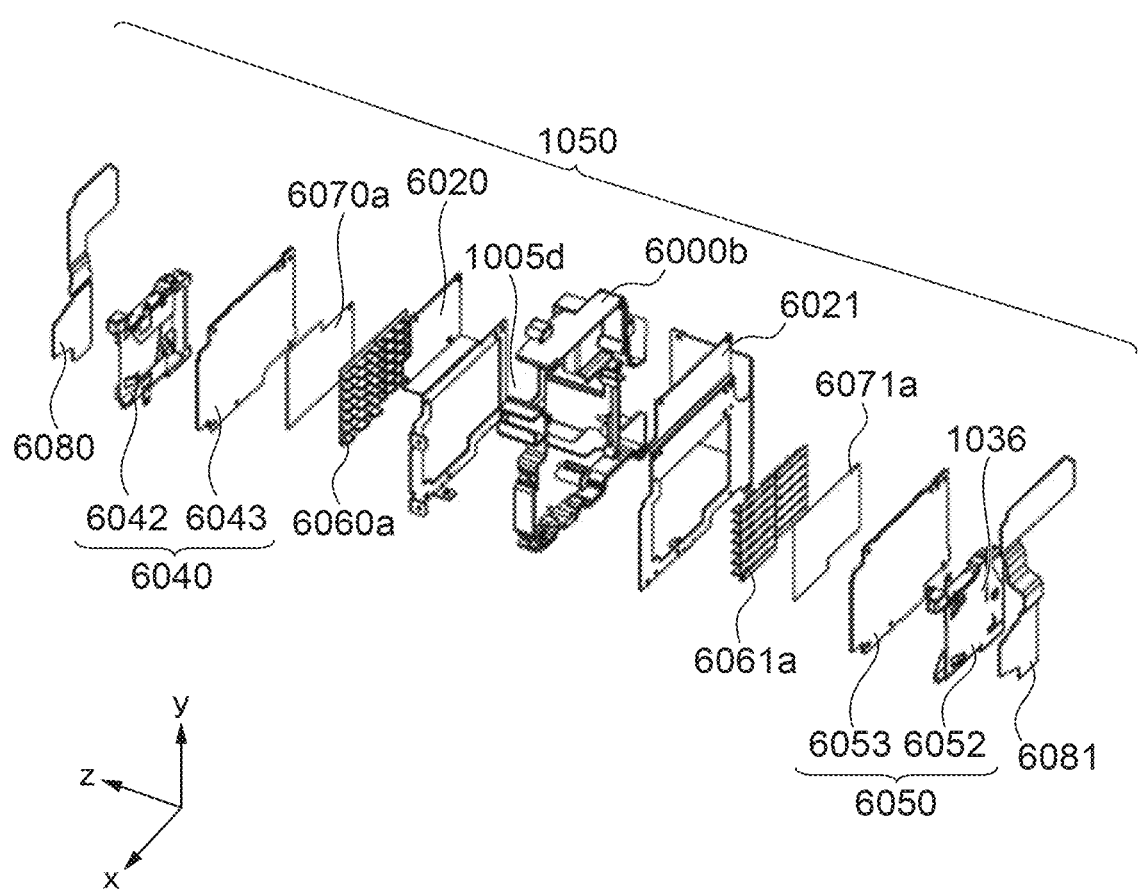
FIG. 26 is a first exploded perspective view of a variation of the media duct unit.
Figure 27:
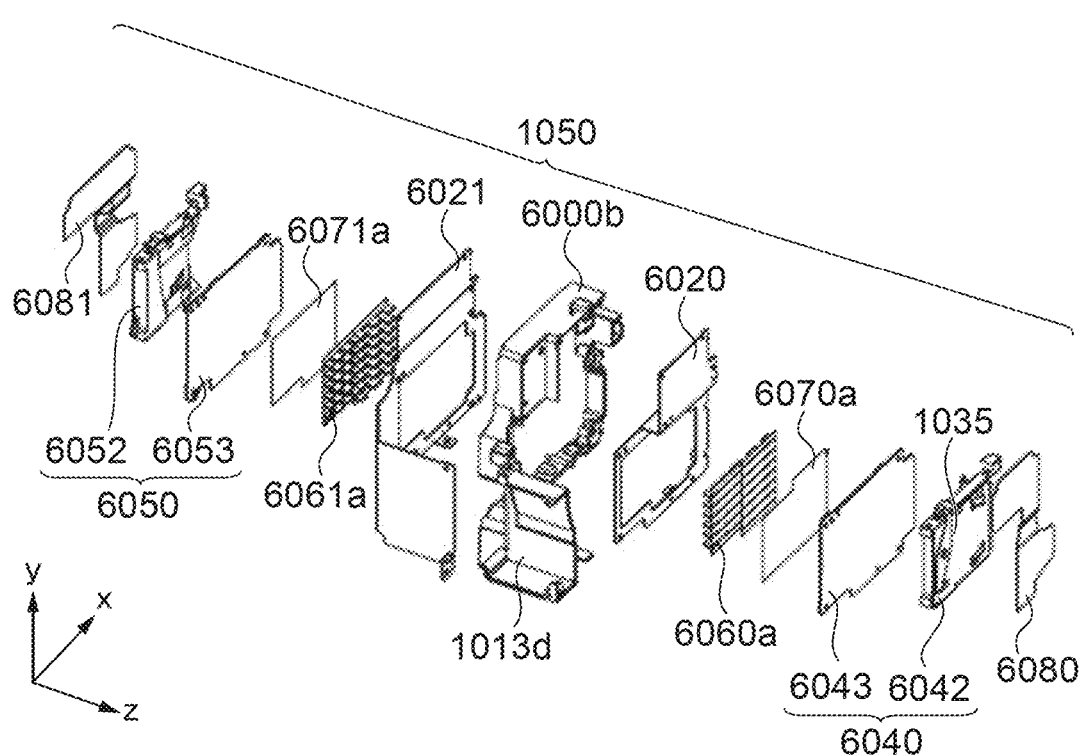
FIG. 27 is a second exploded perspective view of the media duct unit shown in FIG. 26.
Figure 28:
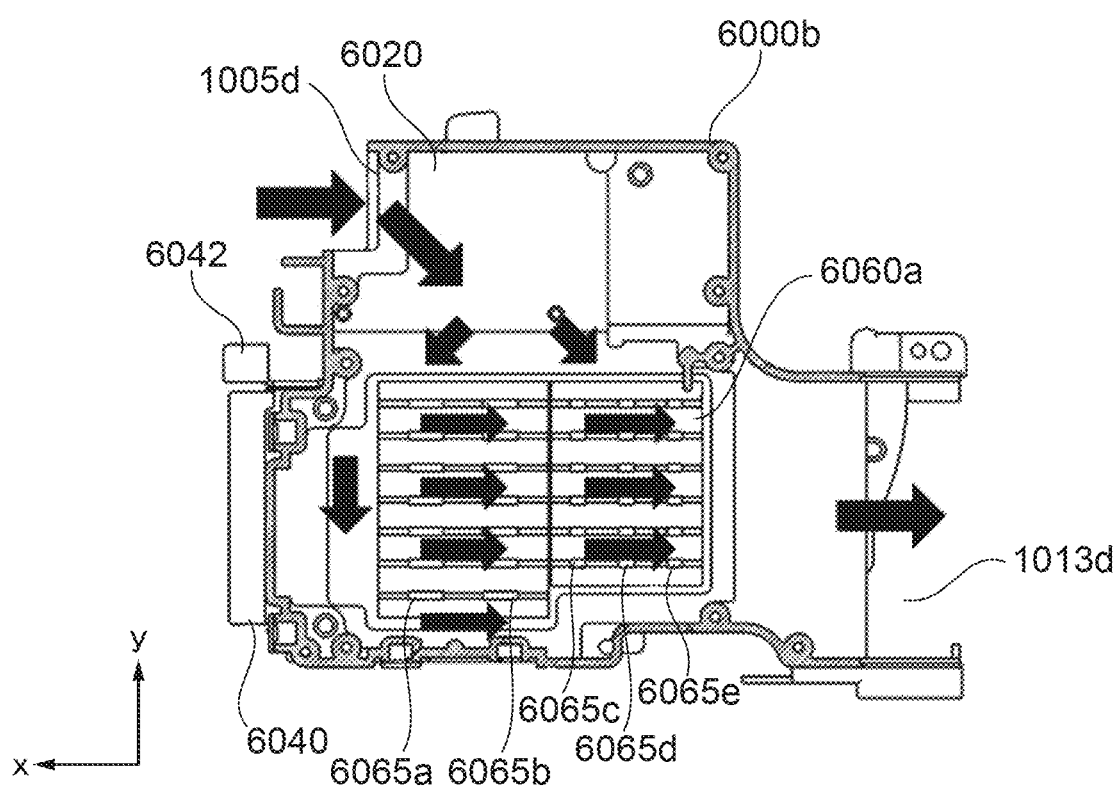
FIG. 28 is a view useful in explaining a flow of air in the media duct unit shown in FIG. 26.

FIG. 26 is a first exploded perspective view of the media duct unit 1050, as viewed obliquely from the rear. FIG. 27 is a second exploded perspective view of the media duct unit 1050, as viewed obliquely from the front. In FIGS. 26 and 27, the first medium card 1004a and the second medium card 1004b are omitted from illustration. FIG. 28 is a view of an x-y cross-section at an intermediate position in the z-axis direction between the first medium substrate 6043 and the second medium substrate 6053, as viewed from the rear, which is useful in explaining a flow of air in the media duct unit 1050.

The first medium unit 6040 is formed of metal or resin and is fixed to the first duct plate 6020 as a component of the media duct unit 1050. The second medium unit 6050 is formed of metal or resin and is fixed to the second duct plate 6021 forming the media duct unit 1050. The first duct plate 6020 and the second duct plate 6021 each have at least one flat portion formed with an opening.

The first medium unit 6040 includes the first medium substrate 6043 and the first medium-holding case 6042 for holding the first medium card 1004a. The first medium-holding case 6042 is formed of metal and is fixed to the first medium substrate 6043 by soldering. The front-side surface 1035 of the first medium-holding case 6042 is formed to be flat and is substantially parallel to the first medium substrate 6043.

The second medium unit 6050 includes the second medium substrate 6053 and the second medium-holding case 6052 for holding the second medium card 1004b. The second medium-holding case 6052 is formed of metal and is fixed to the second medium substrate 6053 by soldering. The rear-side surface 1036 of the second medium-holding case 6052 is formed to be flat and is substantially parallel to the second medium substrate 6053.

The media duct unit 1050 includes a medium duct frame 6000b formed of resin. To the medium duct frame 6000b, the first duct plate 6020 to which the first medium unit 6040 is fixed and the second duct plate 6021 to which the second medium unit 6050 is fixed are fixed to form wall surfaces. With this, the media duct unit 1050 has a medium duct ventilation passage formed therethrough which communicates the inlet port 1005d and the outlet port 1013d, and causes air to flow in and out only via the inlet port 1005d and the outlet port 1013d.

Note that non-mounting surfaces of the first medium substrate 6043 and the second medium substrate 6053 are exposed from the openings of the first duct plate 6020 and the second duct plate 6021 to the medium duct ventilation passage, to thereby form part of the wall surfaces of the medium duct ventilation passage.

First fins 6060a formed of a material having high thermal conductivity (such as metal) are thermally and mechanically connected to the non-mounting surface of the first medium substrate 6043 exposed to the medium duct ventilation passage, with a first double-sided adhesive tape 6070a using a material having high thermal conductivity as a base. Further, second fins 6061a formed of a material having high thermal conductivity (such as metal) are thermally and mechanically connected to the non-mounting surface of the second medium substrate 6053 exposed to the medium duct ventilation passage, with a second double-sided adhesive tape 6071a using a material having high thermal conductivity as a base. Note that the function of the first double-sided adhesive tape 6070a and the second double-sided adhesive tape 6071a can be replaced by heat dissipation grease, glue, soldering, heat dissipation rubber, etc.

The flat portion of the first medium-holding case 6042 connected to the first medium substrate 6043 and the flat portion of the first duct plate 6020 in the vicinity of the inlet port 1005d are connected by the first heat conductive member 6080. Further, the flat portion of the second medium-holding case 6052 connected to the second medium substrate 6053 and the flat portion of the second duct plate 6021 in the vicinity of the inlet port 1005d are connected by the second heat conductive member 6081.

Heat generated in the first medium card 1004a is transferred to the first duct plate 6020 via the first medium-holding case 6042 and the first heat conductive member 6080. Further, heat generated in the first medium card 1004a is transferred to the first fins 6060a via the first medium substrate 6043 and the first double-sided adhesive tape 6070a. The heat transferred to the first duct plate 6020 and the first fins 6060a is transferred to air flowing through the medium duct ventilation passage.

Heat generated in the second medium card 1004b is transferred to the second duct plate 6021 via the second medium-holding case 6052 and the second heat conductive member 6081. Further, heat generated in the second medium card 1004b is transferred to the second fins 6061a via the second medium substrate 6053 and the second double-sided adhesive tape 6071a. The heat transferred to the second duct plate 6021 and the second fins 6061a is transferred to air flowing through the medium duct ventilation passage.

Arrows appearing in FIG. 28 represent streams of air in the media duct unit 1050. The inlet port 1005d and the outlet port 1013d are arranged at substantially diagonal positions in the medium duct frame 6000b. Air flowing in from the inlet port 1005d flows through the medium duct ventilation passage and is discharged to the outlet port 1013d. At this time, air flowing through the medium duct ventilation passage flows in a space where the first fins 6060a and the second fins 6061a are not present, and then flows along the first fins 6060a and the second fins 6061a to be discharged to the outlet port 1013d. With this, it is possible to cause air to flow in the entire inside of the media duct unit 1050. Further, a contact area with air is increased by the first fins 6060a and the second fins 6061a, and hence it is possible to efficiently transfer heat generated in the first medium card 1004a and the second medium card 1004b to air.

Note that a first slit 6065a, a second slit 6065b, a third slit 6065c, a fourth slit 6065d, and a fifth slit 6065e are cuts in the fins in the x-axis direction. The first slit 6065a to the fifth slit 6065e are formed at predetermined intervals in the y-axis direction. By making the first slit 6065a and the second slit 6065b larger in width than the third slit 6065c to the fifth slit 6065e, it is possible to make air easier to reach a space distant from the outlet port 1013d. As a result, it is possible to more efficiently transfer heat generated in the first medium card 1004a and the second medium card 1004b to air.

Next, a media duct unit 1060 as another variation of the media duct unit 1040 will be described. Note that the same components of the media duct unit 1060 as those of the above-described media duct unit 1050 are described using the same reference numerals.

Figure 29:
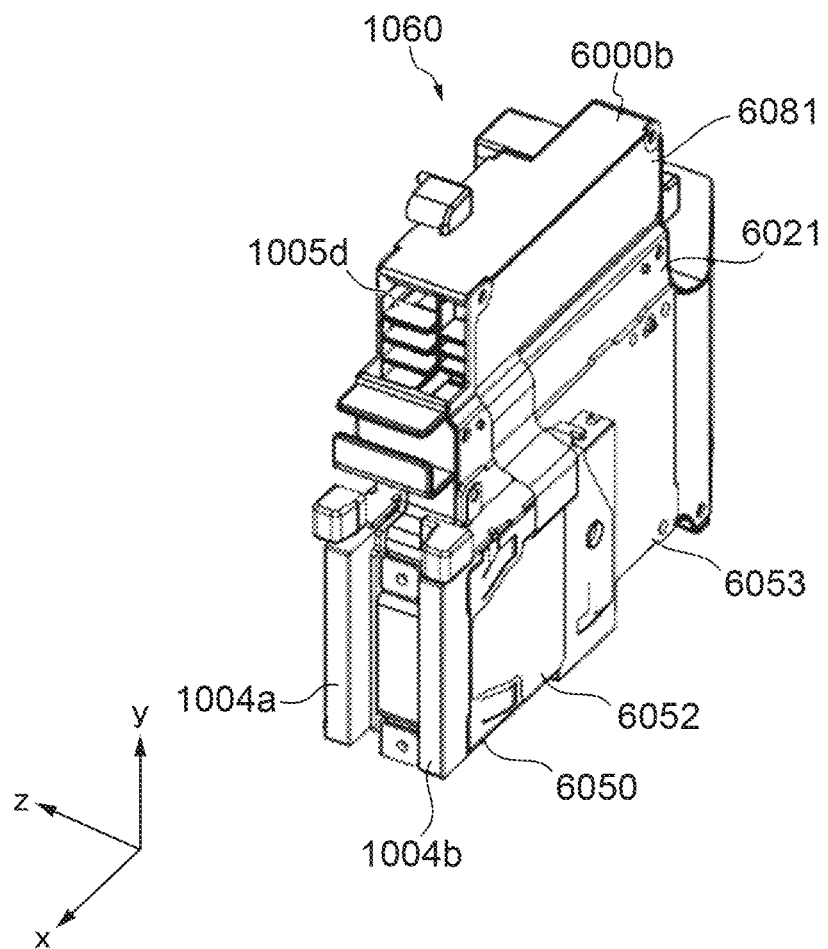
FIG. 29 is a perspective view of another variation of the media duct unit, as viewed obliquely from the rear.
Figure 30:
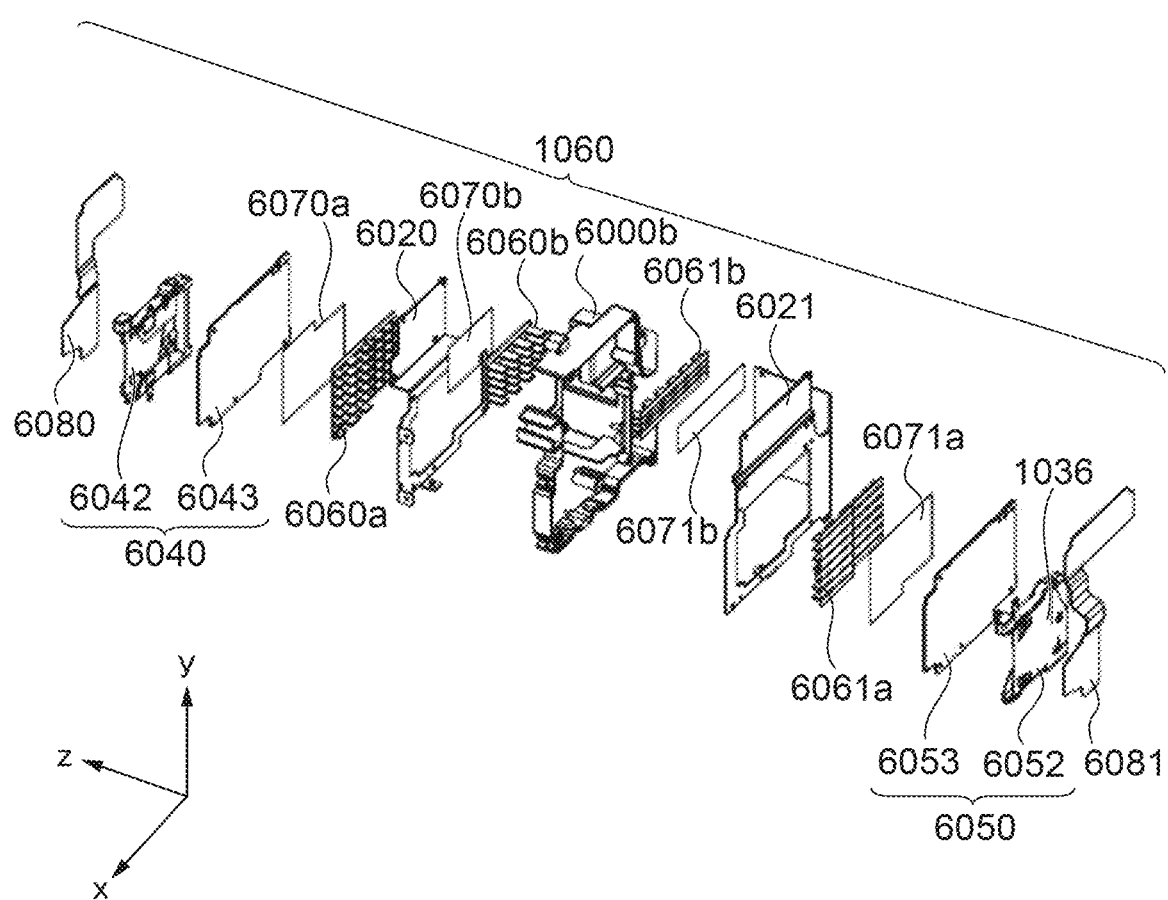
FIG. 30 is a first exploded perspective view of the media duct unit shown in FIG. 29.
Figure 31:
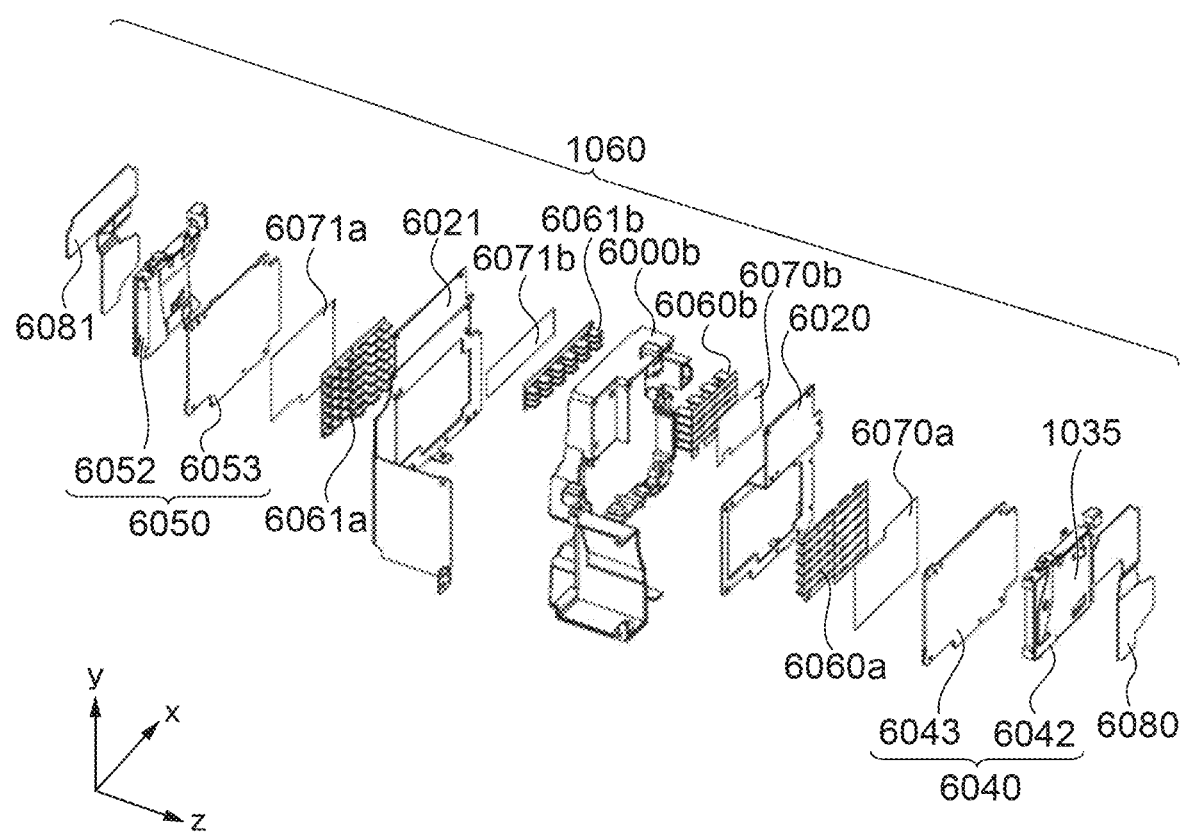
FIG. 31 is a second exploded perspective view of the media duct unit shown in FIG. 29.

FIG. 29 is a perspective view of the media duct unit 1060, as viewed obliquely from the rear. FIG. 30 is a first exploded perspective view of the media duct unit 1060, as viewed obliquely from the rear. FIG. 31 is a second exploded perspective view of the media duct unit 1060, as viewed obliquely from the front. In FIGS. 30 and 31, the first medium card 1004a and the second medium card 1004b are omitted from illustration.

The media duct unit 1060 differs from the media duct unit 1050 in that third fins 6060b and fourth fins 6061b area provided anew. Therefore, the description is given mainly of this different point and description of the same components as those of the media duct unit 1050 is omitted.

The third fins 6060b formed of metal or resin are thermally and mechanically connected to the flat portion of the first duct plate 6020, which faces a portion of the medium duct ventilation passage in the vicinity of the inlet port 1005d, with a third double-sided adhesive tape 6070b. Further, the fourth fins 6061b formed of metal or resin are thermally and mechanically connected to the flat portion of the second duct plate 6021, which faces a portion of the medium duct ventilation passage in the vicinity of the inlet port 1005d, with a fourth double-sided adhesive tape 6071b. Note that the function of the third double-sided adhesive tape 6070b and the fourth double-sided adhesive tape 6071b can be replaced by heat dissipation grease, glue, soldering, heat dissipation rubber, etc.

Heat transferred from the first medium-holding case 6042 to the first duct plate 6020 via the first heat conductive member 6080 is transferred to the third fins 6060b via the third double-sided adhesive tape 6070b. Further, heat transferred from the second medium-holding case 6052 to the second duct plate 6021 via the second heat conductive member 6081 is transferred to the fourth fins 6061b via the fourth double-sided adhesive tape 6071b. The heat transferred to the third fins 6060b and the fourth fins 6061b is transferred to air flowing through the medium duct ventilation passage.

By providing the third fins 6060b and the fourth fins 6061b, a contact area with air flowing through the medium duct ventilation passage is increased, and hence it is possible to more efficiently cool the first medium card 1004a and the second medium card 1004b.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. Further, the embodiments of the present invention are described only by way of example, and it is possible to combine the embodiments on an as-needed basis.

This application claims the benefit of Japanese Patent Application No. 2019-150316 filed Aug. 20, 2019, which is hereby incorporated by reference herein in its entirety.

What is claimed is:
1. An image capturing apparatus including:
an image sensor,
a circuit board disposed substantially parallel to the image sensor, and
a cooling unit configured to cool at least one of the image sensor and the circuit board,
wherein the cooling unit comprises:
a duct having an air flow passage crossing an optical axis of the image sensor; and
a fan that causes air to flow in the air flow passage in the duct, and
wherein a face of an air inlet port of the duct is disposed on a first side of the image capturing apparatus and a face of an air outlet port of the duct is disposed at an angle greater than 0° to the first side of the image capturing apparatus such that the face of the air outlet port does not enter is not parallel to the face of the air inlet port, and
wherein the duct has a wall portion that separates the air flow passage into a first air flow passage on an inlet side and a second air flow passage on an outlet side.

2. The image capturing apparatus according to claim 1, wherein the air flow passage in the duct extends from one surface of the image capturing apparatus in which the air inlet port and the air outlet port are disposed toward another surface opposite to the one surface.

3. The image capturing apparatus according to claim 1, wherein the air inlet port and the air outlet port are formed with a predetermined angle therebetween and are not parallel with each other.

4. The image capturing apparatus according to claim 1, wherein one of the inlet side and the outlet side of the wall portion is formed of a resin material.

5. An image capturing apparatus having a plurality of heat sources, comprising:
a fan;
a first circuit board that is one of the heat sources;
a second circuit board that is one of the heat sources and is disposed substantially parallel to the first circuit board; and
a duct that is disposed between the first circuit board and the second circuit board and is thermally connected to the first circuit board and the second circuit board,
wherein the fan and the second circuit board are connected to the same surface of the duct,
wherein the duct has a partition wall for partitioning an air flow passage of air drawn in from an air inlet port of the duct, and
wherein one of flow passages into which the air flow passage is partitioned by the partition wall is formed at a location overlapping the substantially entire area of the second circuit board, and not overlapping a fan opening of the fan when viewed from a direction perpendicular to the mounting surface of the second circuit board.

6. The image capturing apparatus according to claim 5, wherein the second circuit board has a circuit for controlling a power supply, and
wherein when viewed from a direction perpendicular to a mounting surface of the second circuit board, at least part of a battery mounted on the image capturing apparatus and a power supply terminal overlaps the second circuit board.

7. The image capturing apparatus according to claim 5, wherein the first circuit board and the second circuit board are thermally connected to the duct via an elastic heat transfer member.

8. An image capturing apparatus having a plurality of heat sources, comprising:
a holding member that holds a recording medium that is one of the heat sources;
a circuit board to which the holding member is fixed;
a duct that has an air inlet port and an air outlet port and is thermally connected to the circuit board; and
a fan that draws air from the air inlet port and discharges the air from the air outlet port,
wherein fins are provided on a wall surface of the duct, and
wherein the fins are disposed on the circuit board exposed to the air flow passage in the duct.

9. The image capturing apparatus according to claim 8, wherein the fins have a plurality of slits, and
wherein the plurality of slits are formed such that slits disposed at a location closer to the air outlet port are smaller in width than slits disposed at a location closer to the air inlet port.

10. The image capturing apparatus according to claim 8, wherein at least part of the circuit board is exposed to the air flow passage in the duct.

11. An image capturing apparatus having a plurality of heat sources, comprising:
a holding member that holds a recording medium that is one of the heat sources;
a circuit board to which the holding member is fixed;
a duct that has an air inlet port and an air outlet port and is thermally connected to the circuit board;
a fan that draws air from the air inlet port and discharges the air from the air outlet port; and
a rib-shaped member provided within the duct such that the rib-shaped member extends from the air outlet port of the duct and crosses an air flow passage connecting between the air inlet port and the air outlet port,
wherein the rib-shaped member separates the air flow passage into a first air flow passage on an inlet side and a second air flow passage on an outlet side.

12. The image capturing apparatus according to claim 11, wherein the width of the rib-shaped member becomes smaller as the rib-shaped member extends farther from the air outlet port.

13. The image capturing apparatus according to claim 11, wherein at least part of the circuit board is exposed to the air flow passage in the duct.

* * * * *